(12) United States Patent
Dieny et al.

(10) Patent No.: US 9,508,920 B2
(45) Date of Patent: Nov. 29, 2016

(54) VOLTAGE-CONTROLLED MAGNETIC DEVICE OPERATING OVER A WIDE TEMPERATURE RANGE

(71) Applicants: COMMISSARIAT Á L'ÉNERGIE ATOMIQUE ET AUX ÉNERGIES ALTERNATIVES, Paris (FR); CENTRE NATIONAL DE LA RECHERCHE SCIENTIFIQUE (CRNS), Paris Cedex 16 (FR)

(72) Inventors: Bernard Dieny, Lans en Vercors (FR); Hélène Bea, Voiron (FR); Sébastien Bandiera, Corenc (FR)

(73) Assignees: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE (CNRS), Paris (FR); UNIVERSITÉ JOSEPH FOURIER, Grenoble (FR)

( * ) Notice: Subject to any disclaimer, the term of this patent is extended or adjusted under 35 U.S.C. 154(b) by 0 days.

(21) Appl. No.: 14/906,770

(22) PCT Filed: Jul. 18, 2014

(86) PCT No.: PCT/EP2014/065510
§ 371 (c)(1),
(2) Date: Jan. 21, 2016

(87) PCT Pub. No.: WO2015/011050
PCT Pub. Date: Jan. 29, 2015

(65) Prior Publication Data
US 2016/0172579 A1    Jun. 16, 2016

(30) Foreign Application Priority Data

Jul. 22, 2013    (FR) .................................... 13 57207

(51) Int. Cl.
*G11C 11/15*      (2006.01)
*H01L 43/02*      (2006.01)
(Continued)

(52) U.S. Cl.
CPC ............. *H01L 43/02* (2013.01); *G01R 33/093* (2013.01); *G01R 33/1284* (2013.01);
(Continued)

(58) Field of Classification Search
CPC ....................................................... G11C 11/15
See application file for complete search history.

(56) References Cited

U.S. PATENT DOCUMENTS

2013/0175646 A1    7/2013  Kim et al.
2014/0284539 A1*   9/2014  Eeh .......................... H01L 43/12
                                                                           257/4

OTHER PUBLICATIONS

Kawahara, T., "Challenges toward gigabit-scale spin-transfer torque random access memory and beyond for normally off, green information technology infrastructure (invited)," Journal of Applied Physics 109, 07D325, (2011).

(Continued)

*Primary Examiner* — Hoai V Ho
(74) *Attorney, Agent, or Firm* — Pillsbury Winthrop Shaw Pittman LLP

(57) ABSTRACT

A voltage-controlled spintronic device includes a magnetic layer having an effective anisotropy Keff; a non-magnetic insulating layer; a contact layer; the magnetic layer having an anisotropy switching threshold such that application of a polarization voltage Vmax allows switching of the effective anisotropy $K_{eff}$ from a direction perpendicular to the reference plane to a direction in the reference plane or vice versa, the magnetic layer including a first layer, with thickness $t_B$, having a volume anisotropy $K_{VB}$; a second layer, with thickness $t_A$, having a surface anisotropy $K_{SA}$ and a volume anisotropy $K_{VA}$; the surface anisotropy $K_{SA}$ and the volume anisotropies $K_{VA}$ and $K_{VB}$ respecting, over a given operating temperature range: $Min(K_{SA}(V=0), K_{SA}(V=Vmax))<-\{K_{VB}t_B+K_{VA}t_A\}<Max(K_{SA}(V=0), K_{SA}(V=Vmax))$. $K_{SA}$ (V=0) is the surface anisotropy when no polarization voltage is applied. $K_{SA}$(V=Vmax) is the surface anisotropy when a polarization voltage $V_{max}$ is applied.

14 Claims, 8 Drawing Sheets

(51) Int. Cl.
G11C 11/16 (2006.01)
G01R 33/09 (2006.01)
G01R 33/12 (2006.01)
H01F 10/32 (2006.01)
H01L 43/08 (2006.01)
H01L 43/10 (2006.01)

(52) U.S. Cl.
CPC ............ *G11C 11/15* (2013.01); *G11C 11/161* (2013.01); *H01F 10/329* (2013.01); *H01F 10/3254* (2013.01); *H01L 43/08* (2013.01); *H01L 43/10* (2013.01)

(56) References Cited

OTHER PUBLICATIONS

Manchon, A., et al., "Analysis of oxygen induced anisotropy crossover in Pt/Co/MOx trilayers," Journal of Applied Physics 104, 043914, (2008).

Monso, S., et al., "Crossover from in-plane to perpendicular anisotropy in Pt/CoFe/AlOx sandwiches as a function of the Al oxidation: A very accurate control of the oxidation of tunnel barriers," Applied Physics Letters, vol. 80, No. 22, (2002).

Srinivas, G., et al., "Magnetic and magneto-optical properties of (Pt/Co/Pt/Ni) multilayers," Thin Solid Films 301 (1997), 211-216.

Shiota, Y., et al., "Induction of coherent magnetization switching in a few atomic layers of FeCo using voltage pulses," Nature Materials, vol. 11, Nov. 2011, pp. 39-43.

Yang, H. X., et al., "First-principles investigation of the very large perpendicular, magnetic anisotropy at Fe| MgO and Co|MgO interfaces," Physical Review B, vol. 84, 054401, Aug. 2011, pp. 054401-1-054401-5.

International Preliminary Report on Patentability and the Written Opinion of the International Searching Authority as issued in International Patent Application No. PCT/EP2014/065510, dated Jan. 26, 2016.

International Search Report as issued in International Patent Application No. PCT/EP2014/065510, dated Nov. 10, 2014.

\* cited by examiner

VOLTAGE-CONTROLLED MAGNETIC DEVICE OPERATING OVER A WIDE TEMPERATURE RANGE

CROSS-REFERENCE TO RELATED APPLICATIONS

This is the U.S. National Stage of PCT/EP2014/065510, filed Jul. 18, 2014, which in turn claims priority to French Patent Application No. 1357207, filed Jul. 22, 2013, the entire contents of all applications are incorporated herein by reference in their entireties.

TECHNICAL FIELD OF THE INVENTION

The present invention relates to a voltage-controlled magnetic device operating over a wide temperature range. It notably finds application in the production of MRAM type memories for general public electronics, industrial electronics or military electronics.

TECHNOLOGICAL BACKGROUND OF THE INVENTION

In order to meet continual needs to increase density for CMOS electronics, the size of devices is constantly decreasing. However, these devices have more and more problems of energy consumption, particularly in static mode, due to an increased leakage current linked to their reduction in size.

Non-volatile memories, which conserve their data in the absence of power supply, are very interesting in order to reduce energy consumption. MRAM (magnetic random access memory), which are both non-volatile and capable of assuring rapid reading and writing times, are thus particularly interesting. This type of memory is based on magnetic tunnel junctions, formed by two ferromagnetic layers separated by an insulating oxide, generally magnesium oxide MgO. The resistance of the device varies typically by a factor of 2 to 3 according to whether the magnetisation of the two ferromagnetic layers is parallel or antiparallel, thus providing a magnetic "0" or "1". In an electronic circuit, non-volatility makes it possible to reduce energy consumption by switching off the temporarily inactive parts of the circuit and thus by eliminating leakage current in these parts. New strategies for triggering the power supply are thus rendered possible. The concept of electronic computing in a circuit which is normally off with instantaneous switch on (known as "Normally-Off/Instant-On computing") has even been introduced to describe this approach ("Challenges toward gigabit-scale spin-transfer torque random access memory and beyond for normally off, green information technology infrastructure", Takayuki Kavvahara, J. Appl. Phys. 109, 07D325, 2011).

However, the writing mechanisms of these devices always necessitate a relatively high amount of energy. The least favourable configuration is that of writing with a magnetic field induced by a circulation of current in a conducting line situated in the immediate proximity of the magnetic tunnel junction (generally above or below). In this case, writing requires currents of the order of several mA for around 10 ns. The energy associated with the writing of an event is then several tens of pJ. A memory cell with magnetic field writing 100 is schematically represented in FIG. 1a. The memory cell with magnetic field writing 100 is composed of a first magnetic layer 101 and a second magnetic layer 102, separated by a layer of oxide 103 forming a tunnel barrier. The magnetisation of the first magnetic layer 101, called reference layer, is set in a fixed direction. The magnetisation of the second magnetic layer 102, called storage layer, may be oriented in different directions with respect to the magnetisation of the reference layer 101. A first current line 104 and a second current line 105, situated in the vicinity of the magnetic tunnel junction and generating respectively a first magnetic field Hx and a second magnetic field Hy, make it possible to modify the magnetisation of the storage layer 102.

The use of STT (spin transfer torque) for writing in a magnetic tunnel junction provides a better configuration, in particular when the density is high, that is to say when the memory is of small size (typically less than 50 nm diameter). In fact, in this case, switching is determined by current density. Thus, the smaller the magnetic tunnel junction, the smaller the current required for writing, since the current is equal to the current density multiplied by the area of the magnetic tunnel junction.

At present, magnetic tunnel junctions which have magnetisation perpendicular to the plane of the layers ("perpendicular-to-plane magnetisation") are attracting a lot of attention because they require, for a given writing, a much smaller current density than that required by a magnetic tunnel junction having a magnetisation parallel to the plane of the layers ("in-plane magnetisation"). During spin transfer writing, which will be designated "STT writing" in the remainder of this document, the writing energy is of the order of several pJ, which remains well above the energy typically required to switch on and switch off a CMOS transistor and which is of the order of fJ. This writing energy is mainly associated with dissipation by Joule effect in the magnetic tunnel junction and in the conducting wires connected to the electrodes of the magnetic tunnel junction. A magnetic memory cell with spin transfer writing 110 with magnetisation in the plane of the layers, known as IP ("in plane") is represented schematically in FIG. 1b. The magnetic memory cell with spin transfer writing 110 is composed of a first magnetic layer 111 and a second magnetic layer 112, separated by a layer of oxide 113 forming a tunnel barrier. The magnetisation of the first magnetic layer 111, called reference layer, is set in a fixed direction in the plane of the layers. The magnetisation of the magnetic layer 112, called storage layer, may be oriented in different directions of the plane of the layers. A first electrode 114 is placed in contact with the storage layer 112. A second electrode 115 is placed in contact with the reference layer 111. A sufficiently important spin polarised current applied through the magnetic tunnel junction by means of first and second electrodes 114 and 115 makes it possible to exert on the magnetisation of the storage layer 112 a torque capable of modifying it.

A magnetic memory cell with spin transfer writing 120 with so-called OP ("out of plane") magnetisation of the layers is schematically represented in FIG. 1c. The magnetic memory cell 120 differs from the magnetic memory cell 110 in that:
 the magnetisation of the reference layer 121 is set in a fixed direction out of plane of the layers;
 the magnetisation of the storage layer 122 may be oriented in different directions out of plane of the layers.

Nevertheless, a drawback of STT writing is linked to the reliability of the tunnel barrier. In fact, the memory is crossed by a relatively high current density, of the order of MA/cm², at each writing which induces a risk of dielectric breakdown. Thermally assisted switching, which consists in assisting the switching of magnetisation by temporary heating of the magnetic tunnel junction, makes it possible to facilitate switching at the moment of writing while assuring very good stability of the magnetisation outside of writing regime.

A memory cell with thermally assisted magnetic field writing 100' is schematically represented in FIG. 1d. The memory cell with thermally assisted magnetic field writing 100' differs from the memory cell with magnetic field writing 100 in that a current is applied through the magnetic tunnel junction, prior to the switching of magnetisation of the storage layer 102, so as to reduce substantially the magnetic field to apply to the junction to carry out the switching of magnetisation. Nevertheless, electric field writing always leads to high energy consumption.

A magnetic memory cell with thermally assisted spin transfer writing with magnetisation "in the plane" 110' is schematically represented in FIG. 1e. The memory cell with thermally assisted spin transfer writing 110' differs from the magnetic memory cell with spin transfer writing 110 in that the current flowing through the magnetic tunnel junction is used both to heat the storage layer of the cell and to exert the STT torque enabling the switching of the magnetisation of the storage layer 112, so as to reduce substantially the current to apply to the junction to carry out the switching of magnetisation.

A magnetic memory cell with thermally assisted spin transfer writing with out of plane magnetisation 120' is represented schematically in FIG. 1f. The memory cell with thermally assisted spin transfer writing differs from the magnetic memory cell with spin transfer writing 120 in that the current flowing through the magnetic tunnel junction is used both to heat the storage layer of the cell and to exert the STT torque enabling the switching of the magnetisation of the storage layer 122, so as to reduce substantially the current to apply to the junction to carry out the switching of magnetisation. However, these two latter devices still pose problems of reliability.

A new approach for changing the resistance of a magnetic tunnel junction with perpendicular magnetisation, that is to say to change the direction of magnetisation, consists in using an electric field with extremely weak currents crossing the device. Rapid switching with low energy consumption has been obtained with this type of device ("Induction of coherent magnetization switching in a few atomic layers of FeCo using voltage pulse", Yoichi Shiota et al. Nature materials, 11, 39, 2012).

The possibility of changing the magnetisation of a thin magnetic metallic film with an electric field is due to a change in the magnetic anisotropy of the film thanks to the electric field applied. Given that in metals the electric field is screened over a very short distance, called "Fermi distance" and which is 0.2 nm in metals commonly used for the electrodes of magnetic tunnel junctions, the influence of the electric field on the anisotropy is uniquely interfacial. In the case where the thin ferromagnetic film is in contact with an insulating layer, an electric field may be applied through the insulating layer and in the magnetic metallic layer over the Fermi screening distance. This field can locally change the state density along the interface between the magnetic layer and the insulating layer, which can in turn modify the surface anisotropy which exists at this interface ("First-principles investigation of the very large perpendicular magnetic anisotropy at Fe/MgO and Co/MgO interfaces", Yang et al., Physical Review B 84, 054401, 2011). This is the case in particular at interfaces of buffer layer/CoFeB/MgO or buffer layer/FeCo/MgO type, which are of very great practical importance in magnetic tunnel junctions. This modification leads to a change in the effective anisotropy $K_{eff}$, which leads to an effective anisotropy perpendicular to the plane or in the plane, according to the equation:

$$K_{eff} = -\frac{1}{2}\mu_0 M_s^2 + K_V + \frac{K_{s1}(V) + K_{s2}}{t_F}$$

In this equation, $K_{s2}$ is the surface anisotropy at the buffer layer/magnetic metal interface; $K_{s1}$ is the surface anisotropy at the magnetic metal/oxide interface; $-\frac{1}{2}\mu_0 M_s^2 + K_V$ is the volume anisotropy which includes in its first term the shape anisotropy and in its second term the magnetocrystalline anisotropy; $t_F$ is the thickness of the ferromagnetic film.

The effective anisotropy $K_{eff}$ is the sum of the contributions of the surface anisotropies related to the volume by dividing by the thickness of the ferromagnetic film, and of the volume anisotropies.

FIG. 2 is a graphic representation of the evolution of the effective anisotropy $K_{eff}$ multiplied by the thickness $t_F$ of the ferromagnetic film, as a function of the thickness $t_F$ of the ferromagnetic film. This graphic representation is a straight line of which the slope is proportional to the contribution of the volume anisotropy, that is to say to the shape anisotropy $-\frac{1}{2}\mu_0 M_s^2$, plus the magnetocrystalline anisotropy $K_V$, the magnetocrystalline anisotropy nevertheless being generally negligible in the devices implemented.

By convention, in magnetism, when an effective anisotropy is positive, the magnetisation is spontaneously oriented out of plane. On the contrary, when an anisotropy is negative, the magnetisation is spontaneously oriented in plane. Hence, throughout the present application, a switching of anisotropy will signify, by a commonly employed misuse of language, a change of sign of the anisotropy which leads to a spontaneous switching of the orientation of the magnetisation of the layer considered.

The contribution of the shape anisotropy is always a negative value because it contributes systematically to an in plane orientation of the magnetisation.

The intersection of the straight line with the straight line of equation $t_F=0$ gives the contribution of the surface anisotropy $K_{s1}+K_{s2}$, which is here positive (see FIG. 2) and thus contributes to an out of plane orientation of the magnetisation.

When an electric field is applied, only the surface anisotropy is capable of being modified on account of the screening of the field in the magnetic metallic electrode, which thus leads to changes in the curves. These changes are explained in relation with FIG. 3a. FIG. 3a shows:

a first graphic representation 31, when no polarisation voltage is applied (V=0), of the effective anisotropy $K_{eff}$ multiplied by the thickness $t_F$ of the ferromagnetic film, as a function of the thickness $t_F$ of the ferromagnetic film;

a second graphic representation 32, when a non-zero polarisation voltage $V=V_{max}$ is applied to the terminals of the device, of the effective anisotropy $K_{eff}$ multiplied by the thickness $t_F$ of the ferromagnetic film, as a function of the thickness $t_F$ of the ferromagnetic film.

A translation along the y-axis of the second graphic representation 32 compared to the first graphic representation 31 is observed.

If the thickness of the ferromagnetic film is correctly chosen, as illustrated in FIG. 3a for a thickness $t_c$ of the ferromagnetic film, the variation in surface anisotropy may lead to a change in sign of all the effective anisotropy. In the case illustrated in FIG. 3a, there is thus an anisotropy perpendicular to the plane when no polarisation voltage is applied, and an anisotropy in the plane when an electric field is applied through the magnetic metal/oxide interface thanks to a polarisation voltage $V=V_{max}$ applied through the oxide layer.

The opposite case is also possible and is illustrated in FIG. 3b. FIG. 3b shows:
- a third graphic representation 33, when no polarisation voltage is applied (V=0), of the effective anisotropy $K_{eff}$ multiplied by the thickness $t_F$ of the ferromagnetic film, as a function of the thickness $t_F$ of the ferromagnetic film;
- a fourth graphic representation 34, when a non-zero polarisation voltage $V=V_{max}$ is applied, of the effective anisotropy $K_{eff}$ multiplied by the thickness $t_F$ of the ferromagnetic film, as a function of the thickness $t_F$ of the ferromagnetic film.

Starting from an anisotropy in the plane when no polarisation voltage is applied (V=0), it is possible to obtain an anisotropy perpendicular to the plane by applying a voltage $V=V_{max}$. This second configuration is obtained by changing the effective anisotropy in order that it is negative when no polarisation voltage is applied (V=0) and by applying a polarisation voltage of inverse sign in order to obtain a positive effective anisotropy at $V=V_{max}$.

It is thus possible to control the switching of the effective anisotropy, from a direction perpendicular to the plane to a direction in the plane and vice versa, as a function of the application or not of a polarisation voltage. Taking as an example the case of an initial magnetisation along a direction in the plane, and an effective anisotropy:
- along a direction in the plane when no polarisation voltage is applied,
- along a direction perpendicular to the plane when a polarisation voltage is applied.

During the application of the polarisation voltage, the magnetisation has a precessional movement around the direction, perpendicular to the plane, of the effective anisotropy. This leads to a magnetisation along an out of plane direction. When the application of the polarisation voltage is stopped, the effective anisotropy and the magnetisation returns to an in plane direction. If a polarisation voltage is applied with a duration corresponding exactly to a half-period (modulo period) of the precession of the magnetisation, then the magnetisation carries out a rotation of an angle $\pi$ rad compared to the initial magnetisation. Thus the final magnetisation is of opposite direction to the initial magnetisation. The control of the switching of the effective anisotropy thus enables a precessional return of the magnetisation.

However, it is important to note that the change in surface anisotropy $\Delta K_{s1}(V)=K_{s1}(0)-K_{s1}(V)$ induced by the electric field is relatively low. With an accessible electric field, that is to say below the dielectric breakdown threshold of the insulating layer which is of the order of $10^9$ V/m, the change in surface anisotropy $\Delta K_{s1}$ may typically be nowadays of the order of 10% of the value of the surface anisotropy $K_{s1}(0)$ when no electric field is applied. In order that the small change in anisotropy causes an important magnetisation variation, it is necessary, by playing on the composition of the materials, the thicknesses of the different materials as well as on the different interfaces, to adjust the effective anisotropy in order that it is situated close to a transition perpendicular to the plane/in the plane. Near to this transition, a 10% variation in the surface anisotropy may in fact be sufficient so that the direction of magnetisation undergoes a rotation, from an "out of plane" direction to an "in the plane" direction and vice versa, thanks to the application of an electric field. Nevertheless, if the system is situated far from such a transition perpendicular to the plane/in the plane for the effective anisotropy, the 10% variation in surface anisotropy induced by the polarisation voltage will not make it possible to change the magnetic orientation and thus will not make it possible to switch the magnetisation. This signifies that such a phenomenon of voltage-controlled anisotropy may be used as a new means of low-consumption writing in a spintronic device uniquely if one is capable of designing the spintronic device considered in such a way that it is situated close to a transition of reorientation of anisotropy between a direction "perpendicular to the plane" and a direction "in the plane", and for this to apply throughout the entire operating temperature range desired for the device.

As explained previously, the effective anisotropy is adjusted to be close to a transition of reorientation of anisotropy between a direction "perpendicular to the plane" and a direction "in the plane" in order that the electric field is capable of modifying sufficiently the surface anisotropy to switch over the direction of the effective anisotropy and thus be able to lead to a reorientation of the magnetisation. An important problem of the prior art is that this condition of proximity of a transition of reorientation of anisotropy is only generally satisfactory over a very narrow temperature range, because thermal variations in thin magnetic films of the surface anisotropy on the one hand, and of the volume anisotropy on the other hand, are generally different. This is illustrated in FIG. 4. FIG. 4 shows:
- the curve "surf(V=0)", when no polarisation voltage is applied, of the surface anisotropy $K_s$ as a function of temperature;
- the curve "surf(V=$V_{max}$)", when a non-zero polarisation voltage $V=V_{max}$ is applied, of the surface anisotropy $K_s$ as a function of temperature;
- the curve "vol" of the absolute value of the volume anisotropy multiplied by the thickness of the film $((-\frac{1}{2}\mu_0 M_s^2 K_v)*t_F)$ as a function of temperature;
- the curve "eff(V=0)", when no polarisation voltage is applied, of the product of the thickness of the film and the effective anisotropy $K_{eff}$ as a function of temperature;
- the curve "eff(V=$V_{max}$)", when a non-zero polarisation voltage $V=V_{max}$ is applied, of the product of the thickness of the film and the effective anisotropy $K_{eff}$ as a function of temperature.

The effective anisotropy $K_{eff}$ when no polarisation voltage is applied is the sum of the surface anisotropy $$\frac{K_{s1}(V) + K_{s2}}{t_F}$$

when no polarisation voltage is applied and the volume anisotropy. The effective anisotropy $K_{eff}$ when a non-zero polarisation voltage is applied is the sum of the surface anisotropy $$\frac{K_{s1}(V=0) + K_{s2}}{t_F}$$

when a non-zero polarisation voltage is applied and the volume anisotropy.

It is generally expected that the surface anisotropy varies more rapidly with temperature than the volume anisotropy, due to the fact that the surface spins have a coordination less than the volume spins and are thus more sensitive to thermal fluctuations.

A reorientation of the magnetisation with an electrical field is possible when, for a zero polarisation voltage V=0, the sign of the effective anisotropy $K_{eff}$ is positive (anisotropy perpendicular to the plane) and when, for a non-zero polarisation voltage V=$V_{max}$, the sign of the effective anisotropy $K_{eff}$ is negative (anisotropy in the plane). FIG. 4 shows the temperature interval ΔT for which the reorientation of the magnetisation with an electrical field is possible. This temperature interval is very narrow.

Yet most electronic devices have to be capable of operating over a wide temperature range: between 0° C. and 70° C. for general public electronics for example, or between −40° C. and 85° C. for industrial electronics. Over such temperature ranges, the condition of proximity of a transition of reorientation of anisotropy is not respected in the prior art. Thus, the electric field controlled devices proposed in the prior art can only operate in a narrow temperature range: they could for example operate correctly at 20° C., but not at 50° C.

GENERAL DESCRIPTION OF THE INVENTION

The invention offers a solution to the aforementioned problems by proposing a multilayer stack of which the magnetic anisotropy may be controlled by an electric field and which remains close to a transition of reorientation between a direction "perpendicular to the plane" and a direction "in the plane" over a wide temperature range.

The invention thus essentially relates to a voltage-controlled magnetic device comprising:
  a magnetic layer extending along a reference plane and having a variable direction magnetisation and an effective anisotropy $K_{eff}$;
  a non-magnetic insulating layer extending onto the magnetic layer;
  a contact layer extending onto the insulating layer;
  a means of applying a polarisation voltage between the contact layer and the magnetic layer, through the non-magnetic insulating layer;
  said magnetic layer having an anisotropy switching threshold such that the application of a polarisation voltage $V_{max}$ through the insulating layer enables switching of the effective anisotropy $K_{eff}$ from a direction perpendicular to the reference plane to a direction in the reference plane or vice versa,
  the magnetic layer of said magnetic device comprising:
    a first layer, called "volume layer", with thickness $t_B$, having a first volume anisotropy $K_{VB}$
    a second layer, called "surface layer", with thickness $t_A$, having a surface anisotropy $K_{SA}$ and a second volume anisotropy $K_{VA}$, the surface layer being situated between the volume layer and the non-magnetic insulating layer;
  the composition and the thickness of the surface and volume layers being chosen in order that the surface anisotropy $K_{SA}$ and the first and second volume anisotropies $K_{VB}$ and $K_{VA}$ respect, over a given operating temperature range, the following inequality:

$$\text{Min}(K_{SA}(V=0), K_{SA}(V=V_{max})) < -(K_{VB}t_B + K_{VA}t_A) < \text{Max}(K_{SA}(V=0), K_{SA}(V=V_{max}))$$

where $K_{SA}$ (V=0) is the surface anisotropy when no polarisation voltage is applied and $K_{SA}$ (V=$V_{max}$) is the surface anisotropy when the polarisation voltage $V_{max}$ is applied.

"A first volume anisotropy $K_{VB}$" is taken to mean the effective anisotropy of said first layer, which includes the specific volume anisotropy and the surface anisotropies of the two interfaces of this first layer with the adjacent layers. The surface anisotropies at the interfaces do not appear explicitly because they are not modified during the application of a voltage, the electrical field being rapidly screened.

Thanks to the invention, a magnetic layer comprising a volume layer and a surface layer is advantageously used. The volume layer has a first volume anisotropy $K_{VB}$ and the surface layer has a surface anisotropy $K_{SA}$ and a second volume anisotropy $K_{VA}$. The magnetic layer has an effective anisotropy $K_{eff}$ which is the sum, reported to the volume, of the first and second volume anisotropies $K_{VB}$ and $K_{VA}$, respectively weighted by the thickness $t_B$ of the first layer and by the thickness $t_A$ of the second layer, and the surface anisotropy $K_{SA}$:

$$K_{eff} = \frac{K_{VA}t_A + K_{VB}t_B + K_{SA}}{t_A + t_B}$$

If the first and second volume anisotropies $K_{VB}$ and $K_{VA}$ are in a direction in the reference plane, then the surface anisotropy $K_{SA}$ is in a direction out of the reference plane. If the first and second volume anisotropies $K_{VB}$ and $K_{VA}$ are in a direction out of the reference plane, then the surface anisotropy $K_{SA}$ is in a direction in the reference plane. The invention thus makes it possible, by splitting up the magnetic layer into a volume layer and a surface layer, to control independently the temperature evolution of the surface anisotropy $K_{SA}$ and the temperature evolution of the first volume anisotropy $K_{VB}$.

It is thus possible, by optimising the composition and the thickness of the surface and volume layers, to adjust the thermal curves of the surface anisotropy $K_{SA}$ and the first volume anisotropy $K_{VB}$, and thus to control the effective anisotropy $K_{eff}$ so that it remains, over a wide temperature range, close to a transition of reorientation between a direction perpendicular to the reference plane and a direction in the reference plane.

Apart from the characteristics that have just been evoked in the preceding paragraph, the magnetic device according to the invention may have one or more additional characteristics among the following, considered individually or according to any technically possible combinations thereof.

The insulating layer is advantageously made of MgO, $AlO_x$, AlN, $SrTiO_3$, $HfO_x$ or any other insulating oxide or nitride having a dielectric polarisability greater than or equal to 6.

Advantageously, according to first and third embodiments:
  the effective anisotropy $K_{eff}$ is in a direction perpendicular to the reference plane when no polarisation voltage is applied;
  the effective anisotropy $K_{eff}$ is in a direction in the reference plane when the polarisation voltage $V_{max}$ is applied.

According to the first embodiment:
  the surface anisotropy $K_{SA}$ of the surface layer is in a direction perpendicular to the reference plane and the surface anisotropy $K_{SA}$ decreases when the polarisation voltage $V_{max}$ is applied;
  the total volume anisotropy $K_{VB}t_B + K_{VA}t_A$ is in a direction in the reference plane.

A magnetic device according to the invention requires in fact that the surface anisotropy $K_{SA}$ of the surface layer can compensate the first volume anisotropy $K_{VB}$ of the volume layer. Yet it is simpler, in practice, to obtain a strong surface anisotropy in a direction perpendicular to the reference plane, than to obtain a strong surface anisotropy in a direction in the reference plane.

According to the third embodiment:
the surface anisotropy $K_{SA}$ of the surface layer is in a direction in the reference plane and the surface anisotropy $K_{SA}$ increases when the polarisation voltage $V_{max}$ is applied;
the total volume anisotropy $K_{VB}t_B+K_{VA}t_A$ is in a direction perpendicular to the reference plane.

Advantageously, according to second and fourth embodiments:
the effective anisotropy $K_{eff}$ is in a direction in the reference plane when no polarisation voltage is applied;
the effective anisotropy $K_{eff}$ is in a direction perpendicular to the reference plane when the polarisation voltage $V_{max}$ is applied.

According to the second embodiment:
the surface anisotropy $K_{SA}$ of the surface layer is in a direction perpendicular to the reference plane and the surface anisotropy $K_{SA}$ increases when the polarisation voltage $V_{max}$ is applied;
the total volume anisotropy $K_{VB}t_B+K_{VA}t_A$ is in a direction in the reference plane.

A magnetic device according to the invention requires in fact that the surface anisotropy $K_{SA}$ of the surface layer can compensate the first volume anisotropy $K_{VB}$ of the volume layer. Yet it is simpler, in practice, to obtain a strong surface anisotropy in a direction perpendicular to the reference plane, than to obtain a strong surface anisotropy in a direction in the reference plane.

According to the fourth embodiment:
the surface anisotropy $K_{SA}$ of the surface layer is in a direction in the reference plane and the surface anisotropy $K_{SA}$ decreases when the polarisation voltage $V_{max}$ is applied;
the total volume anisotropy $K_{VB}t_B+K_{VA}t_A$ is in a direction perpendicular to the reference plane.

Advantageously, according to the first and second embodiments, the surface layer is made of an alloy based on Co, Fe, Ni or any other material leading, in combination with the insulating layer, to a surface anisotropy $K_{SA}$ perpendicular to the reference plane and having a variation greater than 5% as a function of the application or not of the polarisation voltage $V_{max}$.

According to any of the embodiments, the volume layer having the first volume anisotropy $K_{VB}$ is advantageously a multilayer stack of n elementary patterns of type F1/N1 or F1/N1/F2/N2 or F1/F2, with F1 and F2 two different ferromagnetic materials and N1 and N2 two different non-magnetic materials.

According to any of the embodiments, the volume layer having the first volume anisotropy $K_{VB}$ is advantageously an alloy having a tetragonal structure $L1_0$.

According to any of the embodiments, the volume layer having the first volume anisotropy $K_{VB}$ is advantageously a monolayer of an alloy of type F1F2F3N1N2, with F1, F2 and F3 three different ferromagnetic materials and N1 and N2 two different non-magnetic materials.

Alternatively and according to any of the embodiments:
the contact layer comprises, in contact with the non-magnetic insulating layer, a magnetic layer having a fixed magnetisation direction serving as reference direction for the magnetisation;
the non-magnetic insulating layer is a tunnel barrier enabling a current to circulate by tunnel effect between the contact layer and the magnetic layer;
the device then behaving like a magnetic tunnel junction.

According to this alternative of any of the embodiments, the device advantageously has the following characteristics:
the magnetic layer of the contact layer is an alloy of CoFeB;
the non-magnetic insulating layer is made of MgO;
the surface layer of the magnetic layer is an alloy of CoFeB.

The invention and its different applications will be better understood on reading the description that follows and by examining the figures that accompany it.

BRIEF DESCRIPTION OF THE FIGURES

The figures are presented for indicative purposes and in no way limit the invention. The figures show.

DETAILED DESCRIPTION OF AT LEAST ONE EMBODIMENT OF THE INVENTION

Unless stated otherwise, a same element appearing in the different figures has a single reference.

Figure 1A:
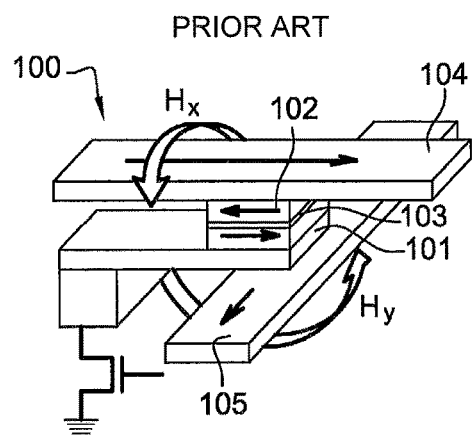
In FIG. 1a, a schematic representation of a memory cell with magnetic field writing according to the prior art.
Figure 1B:
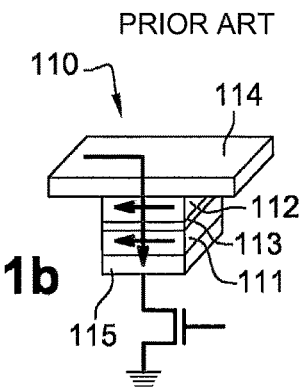
In FIG. 1b, a schematic representation of a magnetic memory cell with spin transfer writing with "in the plane" magnetisation according to the prior art.
Figure 1C:
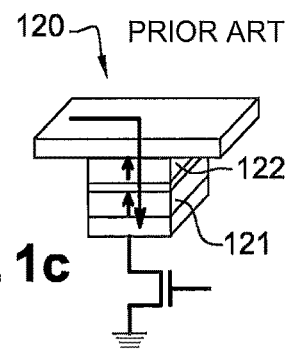
In FIG. 1c, a schematic representation of a magnetic memory cell with spin transfer writing with "perpendicular to the plane" magnetisation according to the prior art.
Figure 1D:
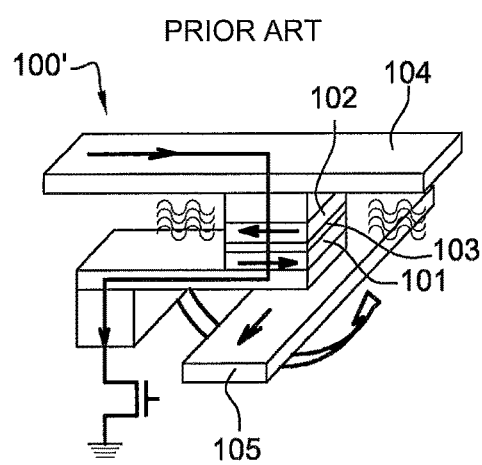
In FIG. 1d, a schematic representation of a memory cell with thermally assisted magnetic field writing according to the prior art.
Figure 1E:
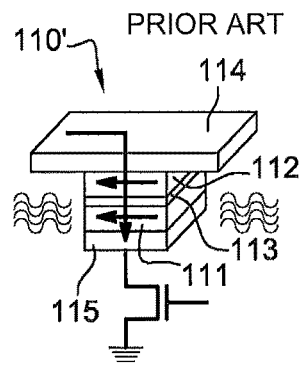
In FIG. 1e, a schematic representation of a magnetic memory cell with thermally assisted spin transfer writing with "in the plane" magnetisation according to the prior art.
Figure 1F:
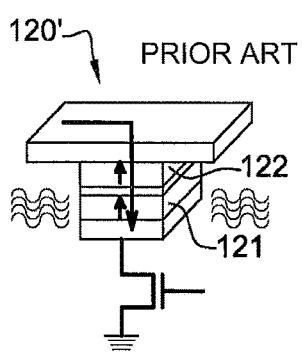
In FIG. 1f, a schematic representation of a magnetic memory cell with thermally assisted spin transfer writing with a "perpendicular to the plane" magnetisation according to the prior art.
Figure 2:
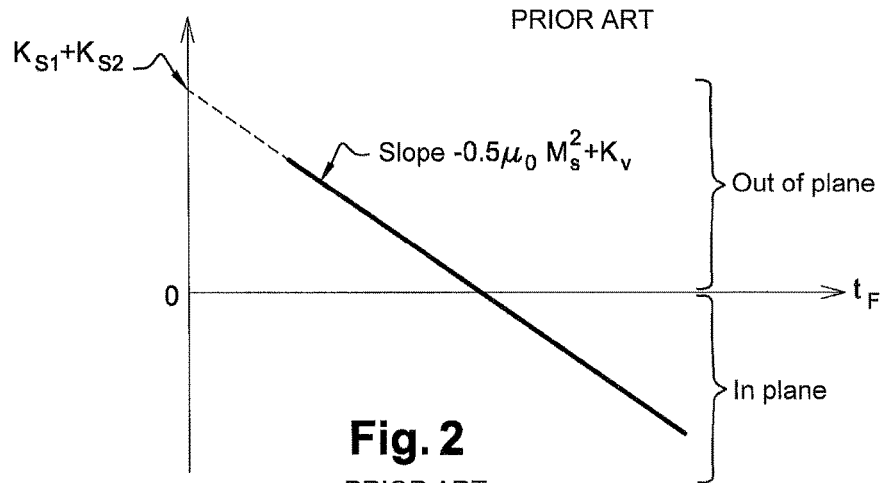
In FIG. 2, a graphic representation of the evolution of the effective anisotropy multiplied by the thickness of the ferromagnetic film as a function of the thickness of the ferromagnetic film in a magnetic memory cell according to the prior art.
Figure 3A:
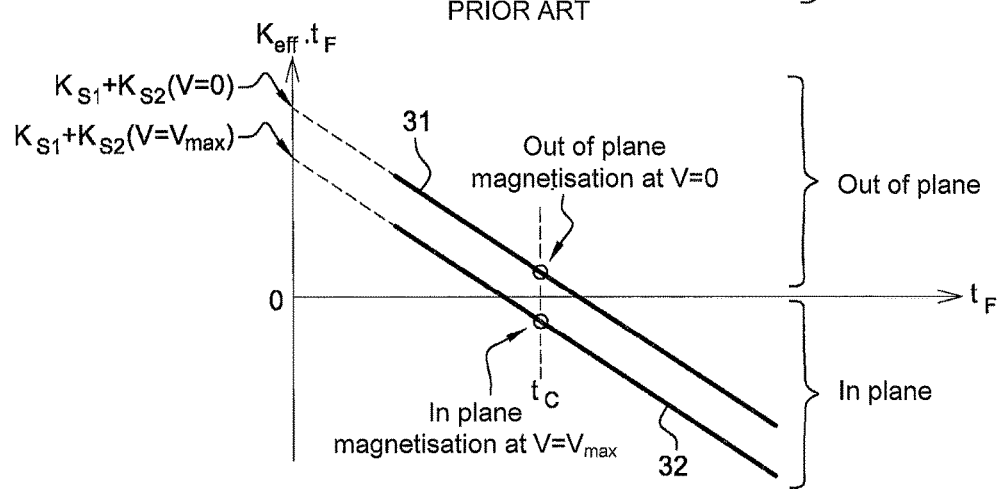
In FIG. 3a, a graphic representation of the evolution of the effective anisotropy multiplied by the thickness of the ferromagnetic film as a function of the thickness of the ferromagnetic film in a magnetic memory cell and as a function of the application or not of an electric field, according to a first configuration according to the prior art.
Figure 3B:
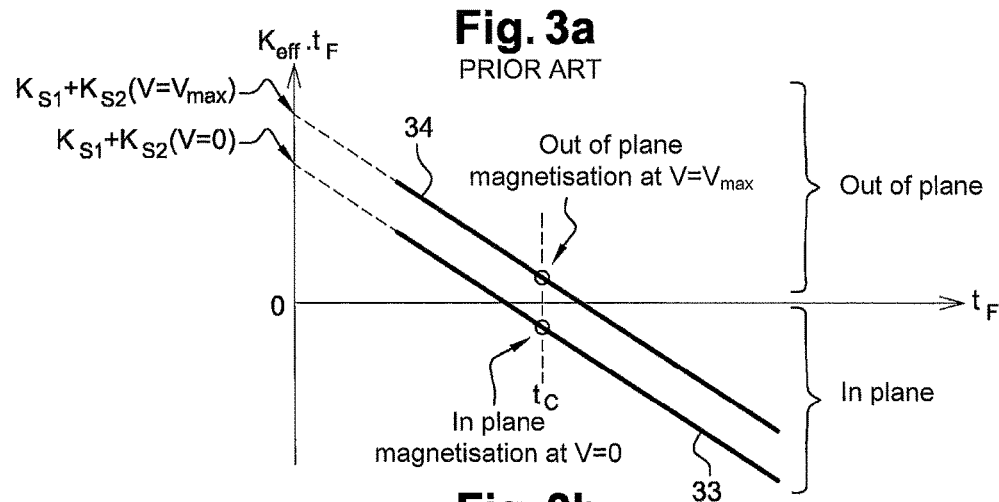
In FIG. 3b, a graphic representation of the evolution of the effective anisotropy multiplied by the thickness of the ferromagnetic film as a function of the thickness of the ferromagnetic film in a magnetic memory cell and as a function of the application or not of an electric field, according to a second configuration according to the prior art.
Figure 4:
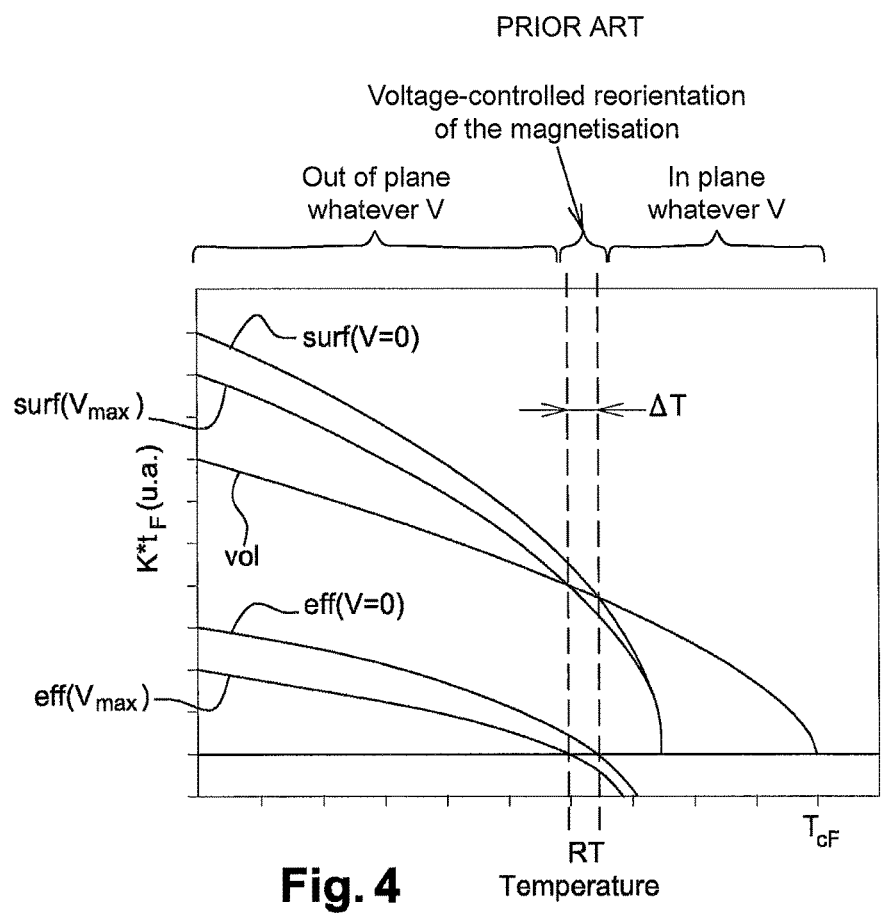
In FIG. 4, a graphic representation of the evolution of the surface anisotropy, of the absolute value of the volume anisotropy multiplied by the thickness of the ferromagnetic film and of the effective anisotropy multiplied by the thickness of the ferromagnetic film as a function of temperature and as a function of the application or not of a polarisation voltage producing an electric field in a magnetic memory cell according to the prior art.
Figure 5:
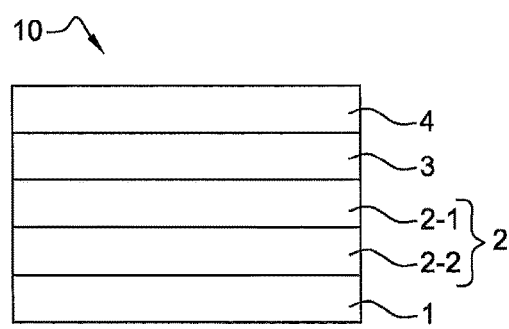
In FIG. 5, a schematic representation of a device according to the invention.

A device 10 according to the invention is schematically represented in FIG. 5. This device 10 includes:
 a buffer layer 1 extending along a reference plane;
 a magnetic layer 2 having an effective anisotropy $K_{eff}$ and extending onto the buffer layer 1;
 a non-magnetic insulating layer 3 extending onto the magnetic layer 2;
 a contact layer 4 extending onto the non-magnetic insulating layer 3 and making it possible to apply a polarisation voltage through the non-magnetic insulating layer 3.

The device may obviously be reversed such that the contact layer is situated in the reference plane with a non-magnetic insulating layer extending onto the contact layer and a magnetic layer having an effective anisotropy $K_{eff}$ and extending onto the buffer layer. In this document, unless stated otherwise, the expressions "out of plane", "perpendicular to the plane" and "in the plane" are understood to be with respect to the reference plane.

The magnetic layer 2 itself includes two magnetically coupled layers:
 a surface layer 2-1 having a surface anisotropy $K_{SA}$ and a second volume anisotropy $K_{VA}$,
 a volume layer 2-2 having a first volume anisotropy $K_{VB}$.

The surface anisotropy of the surface layer 2-1 and the volume anisotropy of the volume layer 2-2 contribute to the effective anisotropy $K_{eff}$ of the magnetic layer 2.

The surface layer 2-1 and the surface layer 2-2 may be separated by a thin layer made of non-magnetic material (not represented) making it possible to assure a structural transition between the structure of the material of the surface layer 2-1 and the structure of the material of the volume layer 2-2 while maintaining a strong magnetic coupling between the magnetisation of the surface layer 2-1 and that of the volume layer 2-2. This thin non-magnetic layer may for example be made of tantalum, titanium or ruthenium with a thickness comprised between 0.2 and 1 nm.

The buffer layer 1 may have one or more functions among the following:
 serving as rear electrode in order to enable an electrical contact with the device 10;
 contributing to the growth of the device 10;
 contributing to creating an anisotropy which will be included in the anisotropy $K_{VB}$.

The buffer layer 1 may for example be made of Ta, NiFeCr, Ru, Ta/Ru. The thickness of this buffer layer 1 is typically comprised between 0.2 and 100 nm.

The interest of the non-magnetic insulating layer 3 is to enable the application of an electric field at the interface between the non-magnetic insulating layer 3 and the magnetic layer 2. In the case where the device 10 is a magnetic tunnel junction, the non-magnetic insulating layer 3 is a tunnel barrier, typically made of MgO, and enables a current to circulate by tunnel effect between the contact layer 4 and the magnetic layer 2. The contact layer 4 is then made of a magnetic material. A tunnel magnetoresistance phenomenon is then brought into play, controlled by the relative orientation of the magnetisation, respectively in the contact layer 4 and in the magnetic layer 2.

The contact layer 4 may be constituted of several layers and fulfil the following functions:
- to establish an electrical contact in the front of the device 10 in order to be able to generate an electrical field at the interface between the non-magnetic insulating layer 3 and the magnetic layer 2;
- in the case where the device 10 is a magnetic tunnel junction, to act as a reference magnetic layer in order that the magnetic tunnel junction has a magnetoresistance tunnel effect controlled by the relative orientation of the magnetisation, respectively in the contact layer 4 and in the magnetic layer 2.

This structure may be reversed, that is to say that the magnetic layer 2 may be above the contact layer 4.

In the case where the device 10 is a magnetic tunnel junction, the contact layer 4 may be a ferromagnetic layer with a fixed magnetisation direction, for example a set magnetisation direction, serving as reference direction for the magnetisation.

The contact layer 4 may typically be made of CuN, or with a multilayer of Ta, Au, Cr, Ru, Cu or (Cu/Ta). In the case where the device 10 is a magnetic tunnel junction, then the contact layer 4 must contain a magnetic layer in contact with the non-magnetic insulating layer 3 in order to generate a magnetoresistance tunnel. This magnetic layer may for example be an alloy of CoFeB, in contact with an insulating layer made of MgO.

The composition of the surface layer 2-1 and the nature of the non-magnetic insulating layer 3 are chosen in order to have an important anisotropy, in a direction perpendicular to the plane or in a direction in the plane, and in order that this anisotropy has a pronounced variation as a function of an electric field.

The volume layer 2-2 is composed of a ferromagnetic material different to that of the surface layer 2-1, or of the same ferromagnetic material as that of the surface layer 2-1 but with a different composition. The composition of the volume layer 2-2 is chosen such that the volume anisotropy of the volume layer 2-2 is adjusted in order to have an effective anisotropy of the magnetic layer 2 close to a transition between a direction perpendicular to the plane and a direction in the plane.

Furthermore, the composition of the ferromagnetic material of the volume layer 2-2 is chosen with respect to the ferromagnetic material of the surface layer 2-1 so that the thermal variation in the total volume anisotropy $K_{VB}t_B + K_{VA}t_A$ practically corresponds, typically to within 10% in relative value, to the thermal variation in the surface anisotropy over the operating temperature range of the device 10.

Consequently, the total anisotropy of the magnetic layer 2 is optimised over a wide temperature range in order to satisfy the specifications required by the desired application. In such a device 10, the effect of the electric field is in fact sufficient to change the sign of the magnetic anisotropy of the magnetic layer 2, thus enabling a voltage-controlled reorientation of the magnetisation, over the whole operating temperature range of the device 10.

The adjustment of the surface and volume is carried out in order to obtain a wide operating temperature range for the device 10. In this aim, in the desired temperature range, the anisotropy is optimised such that:
- the effective anisotropy in the absence of electric field $K_{eff}$ (V=0) is positive,
- and, at the same time, the effective anisotropy in the presence of an electric field $K_{eff}(V=V_{max})$ is negative.

Similarly for another embodiment, in the desired temperature range, the anisotropy is optimised such that:
- the effective anisotropy in the absence of electric field $K_{eff}$ (V=0) is negative,
- and, at the same time, the effective anisotropy in the presence of an electric field $K_{eff}(V=V_{max})$ is positive.

By choosing the materials (nature and thickness), the relative thermal variations in the surface anisotropy and in the volume anisotropy are adjusted, in order that, for a temperature range covering at least the desired operating temperature range for the final device, the thermal variation curve of the total volume anisotropy is situated between the thermal variation curve of the surface anisotropy when no voltage is applied and the thermal variation curve of the surface anisotropy when a voltage $V_{max}$ is applied.

The characteristics of the different layers and the different solutions to obtain a transition of reorientation of anisotropy over a wide operating temperature range are detailed in the remainder of this document.

The surface anisotropy of the surface layer 2-1 may be in a direction perpendicular to the plane or in a direction in the plane.
- When the surface anisotropy of the surface layer 2-1 is in a direction perpendicular to the plane, the volume anisotropy of the volume layer 2-2 is in a direction in the plane.
- On the contrary, when the surface anisotropy of the surface layer 2-1 is in a direction in the plane, the volume anisotropy of the volume layer 2-2 is in a direction perpendicular to the plane.

The effective anisotropy of the magnetic layer 2 may be situated:
- in a direction perpendicular to the plane when no polarisation voltage is applied and in a direction in the plane when a polarisation voltage is applied,
- or instead in a direction in the plane when no polarisation voltage is applied and in a direction perpendicular to the plane when a polarisation voltage is applied.

Thus, according to a first embodiment:
- the surface anisotropy $K_{SA}$ is in a direction perpendicular to the plane and the first and second volume anisotropies $K_{VB}$ and $K_{VA}$ are in a direction in the plane;
- the effective anisotropy $K_{eff}$ is in a direction perpendicular to the plane when no polarisation voltage is applied and in a direction in the plane when a polarisation voltage $V_{max}$ is applied.

First, second, third and fourth variants of this first embodiment of the invention are respectively illustrated in FIGS. 6, 7, 8 and 9.

Figure 6:
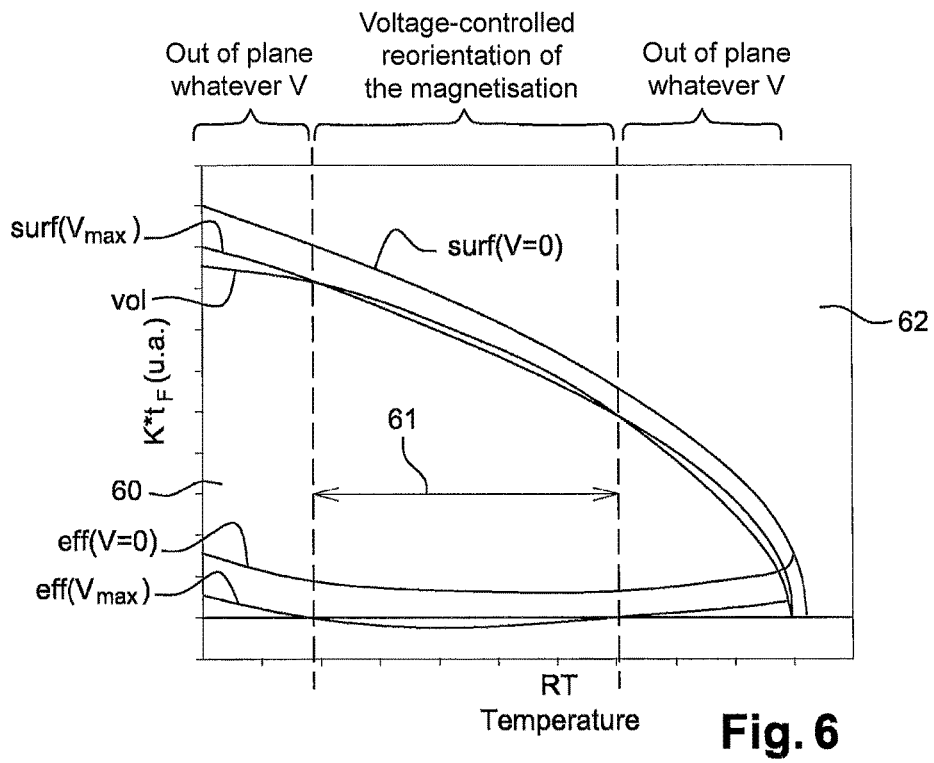
In FIG. 6, a graphic representation of the evolution of the surface anisotropy, of the absolute value of the volume anisotropy multiplied by the thickness of the ferromagnetic film and of the effective anisotropy multiplied by the thickness of the ferromagnetic film as a function of temperature and as a function of the application or not of an electric field in a magnetic memory cell according to a first variant of a first embodiment.

According to the first variant of the first embodiment of the invention, illustrated in FIG. 6:
- for a domain 60 of low temperatures and for a domain 62 of high temperatures, the device 10 has an anisotropy perpendicular to the plane, that is to say an effective anisotropy $K_{eff}>0$, whatever the voltage applied;
- for a large domain 61 of intermediate temperatures, the device has an anisotropy in the plane, that is to say an effective anisotropy $K_{eff}<0$, when a non-zero polarisation voltage $V=V_{max}$ is applied, and conserves an anisotropy perpendicular to the plane ($K_{eff}>0$) when no polarisation voltage is applied.

Figure 7:
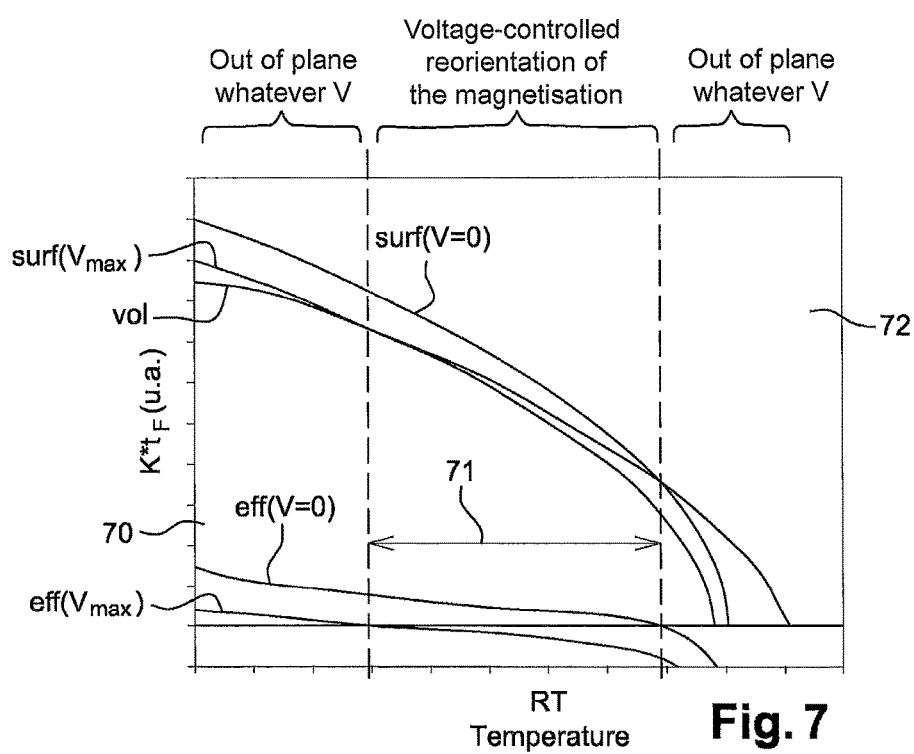
In FIG. 7, a graphic representation of the evolution of the surface anisotropy, of the absolute value of the volume anisotropy multiplied by the thickness of the ferromagnetic film and of the effective anisotropy multiplied by the thickness of the ferromagnetic film as a function of temperature and as a function of the application or not of an electric field in a magnetic memory cell according to a second variant of the first embodiment.

According to the second variant of the first embodiment of the invention, illustrated in FIG. 7:
- for a domain 70 of low temperatures, the device 10 has an anisotropy perpendicular to the plane ($K_{eff}>0$) whatever the polarisation voltage applied;
- for a domain 72 of high temperatures, the device 10 has an anisotropy in the plane ($K_{eff}<0$) whatever the polarisation voltage applied;

for a large domain 71 of intermediate temperatures, the device 10 has an anisotropy perpendicular to the plane ($K_{eff}>0$) when no polarisation voltage is applied and an anisotropy in the plane ($K_{eff}<0$) when a non-zero polarisation voltage $V=V_{max}$ is applied.

Figure 8:
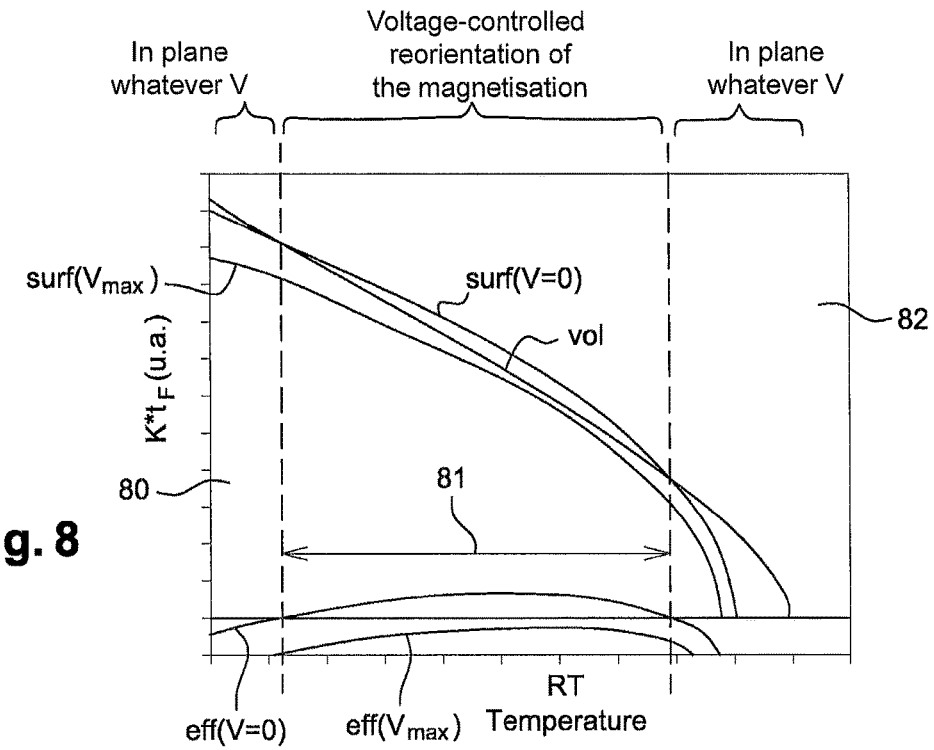
In FIG. 8, a graphic representation of the evolution of the surface anisotropy, of the absolute value of the volume anisotropy multiplied by the thickness of the ferromagnetic film and of the effective anisotropy multiplied by the thickness of the ferromagnetic film as a function of temperature and as a function of the application or not of an electric field in a magnetic memory cell according to a third variant of the first embodiment.

According to the third variant of the first embodiment of the invention, illustrated in FIG. 8:

for a domain 80 of low temperatures and for a domain 82 of high temperatures, the device 10 has an anisotropy in the plane ($K_{eff}<0$) whatever the polarisation voltage applied;

for a large domain 81 of intermediate temperatures, the device 10 has an anisotropy perpendicular to the plane ($K_{eff}>0$) when no polarisation voltage is applied and an anisotropy in the plane ($K_{eff}<0$) when a non-zero polarisation voltage $V=V_{max}$ is applied.

Figure 9:
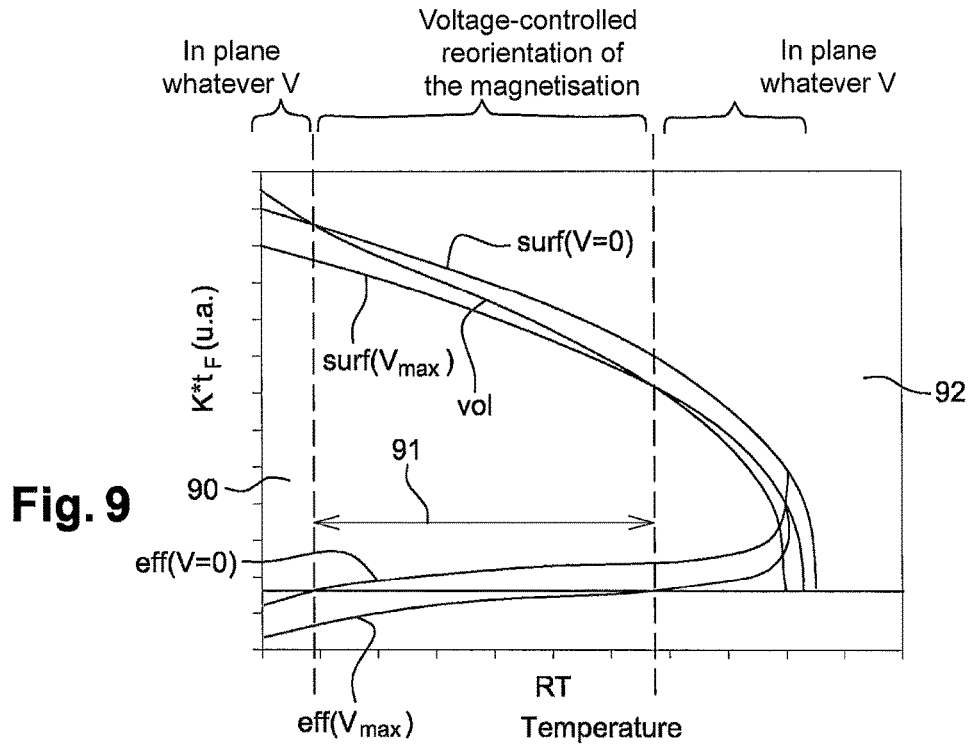
In FIG. 9, a graphic representation of the evolution of the surface anisotropy, of the absolute value of the volume anisotropy multiplied by the thickness of the ferromagnetic film and of the effective anisotropy multiplied by the thickness of the ferromagnetic film as a function of temperature and as a function of the application or not of an electrical field in a magnetic memory cell according to a fourth variant of the first embodiment.

According to the fourth variant of the first embodiment of the invention, illustrated in FIG. 9:

for a domain 90 of low temperatures, the device 10 has an anisotropy in the plane ($K_{eff}<0$) whatever the polarisation voltage applied;

for a domain 92 of high temperatures, the device 10 has an anisotropy perpendicular to the plane ($K_{eff}>0$) whatever the polarisation voltage applied;

for a large domain 91 of intermediate temperatures, the device 10 has an anisotropy perpendicular to the plane ($K_{eff}>0$) when no polarisation voltage is applied and an anisotropy in the plane ($K_{eff}<0$) when a non-zero polarisation voltage $V=V_{max}$ is applied.

The device 10 may be elaborated using PVD (physical vapour deposition) techniques, and in particular thanks to cathodic sputtering (or "direct current sputtering") or thanks to "radio frequency cathodic sputtering".

The non-magnetic insulating layer 3 is typically made of MgO, AlOx, AlN, SrTiO$_3$, HfOx, TaOx or any other insulating oxide or nitride layer. Any material having a large dielectric polarisability, for example greater than or equal to 6, such as HfO$_2$ or SrTiO$_3$, is advantageous in that it contributes to increasing the amplitude of the electrical field created at the interface between the non-magnetic insulating layer 3 and the magnetic layer 2. The thickness of the non-magnetic insulating layer 3 is typically comprised between 0.5 and 2.5 nm. If the device 10 is a magnetic tunnel junction, then the non-magnetic insulating layer 3 must be a tunnel barrier having a high magnetoresistance tunnel ratio, typically above 20% at room temperature.

It has been shown that the phenomenon of anisotropy perpendicular to a magnetic metal/oxide interface is rather generalised (see in particular "Crossover from in-plane to perpendicular anisotropy in Pt/CoFe/AlO$_x$ as a function of the Al degree of oxidation: a very accurate control of the oxidation of tunnel barrier", S. Monso et al., Appl. Phys. Lett. 80, 4157 (2002) or "Analysis of oxygen induced anisotropy crossover in Pt/Co/MO$_x$ trilayers", A. Manchon et al., J. Appl. Phys. 104, 043914 (2008)). Consequently, to form the surface layer 2-1 of the magnetic layer 2, alloys based on Co, Fe or Ni, or other materials leading to a surface anisotropy perpendicular with the non-magnetic insulating layer 3 and has an important influence of the electric field on the surface anisotropy, are suited. In the case where the device 10 is a magnetic tunnel junction, then this surface layer 2-1 of the magnetic layer 2 also has an important magnetoresistance tunnel, typically greater than 20%. To this end, alloys of $(Co_{1-x}Fe_x)_{1-y}B_y$ are particularly suited, with the content (y) of B comprised between 10% and 25% and the content (x) of Fe comprised between 20% and 80%. The thickness of this surface layer 2-1 is typically comprised between 0.2 and 1.5 nm.

In this first embodiment, the volume layer 2-2 of the magnetic layer 2 may be:

a multilayer with a volume anisotropy in the plane, composed of n repetitions of a bilayer of type F1/N1, a bi-layer of type F1/F2 or a quadrilayer of type F1/N1/F2/N2, where F1 and F2 are two ferromagnetic materials, such as for example Fe, Co, Ni, Gd and alloys thereof, and N1 and N2 are two non-magnetic materials, such as for example Cu, Cr, Ta, Ti, Hf, Mo, Ag, Au, Pd, Pt;

a single layer with a volume anisotropy in the plane, made of an alloy such as FePt, FePd, FeNiPt, FeNiPd, FeCuPt or FeCuPd, having a tetragonal structure L1$_0$ with the tetragonal distortion oriented in the plane;

a single layer with a volume anisotropy in the plane, made of an alloy of type F1F2F3N1N2, where F1, F2 and F3 are three ferromagnetic materials, for example Fe, Co, Ni, Gd and alloys thereof, and N1 and N2 are two non-magnetic materials, for example Cr, Ta, Cu, Hf, Ti, Nb, Zr, Mo, Ag, Au, Pd, Pt. Examples of possible alloys are thus: CoCr, CoCrPt, CoCrTa, FeNiTa, CoFeCrPt. The interest of non-magnetic doping is to reduce the volume anisotropy in the plane in order to have an effective anisotropy $K_{eff}$ sufficiently close to zero and able to change its sign thanks to the application of an electric field.

The volume layer 2-2 has a thickness $t_B$, typically comprised between 0.2 and 10 nm, which is chosen sufficiently low so that, when no polarisation voltage is applied, the surface anisotropy perpendicular to the plane outweighs the volume anisotropy in the plane, leading to an effective anisotropy $K_{eff}$ perpendicular to the plane when no polarisation voltage is applied.

The adjustment of the surface and volume anisotropies, in order to obtain notably the conditions of the first, second, third and fourth embodiments of the invention, is carried out by playing on several parameters such as the magnetisation to saturation of the layers and its thermal variation, but also the interface anisotropies and their thermal variation, and the volume anisotropies and their thermal variation. The choice of materials and the composition of the surface layer 2-1 and the volume layer 2-2 forming the magnetic layer 2, of the buffer layer 1 and of the contact layer 4 contributes to modifying all these parameters in order to adjust the thermal variations of the effective anisotropy and to enable a voltage control over a wide temperature range.

In general, it is easier to adjust the thermal variation of the volume anisotropy in the plane in order that it corresponds approximately to the thermal variation of the surface anisotropy perpendicular to the plane. In fact, there are more parameters available on which to play for the volume layer 2-2 than for the surface layer 2-1. In most cases, and in particular when the device 10 is a magnetic tunnel junction, the surface layer 2-1 in contact with the non-magnetic insulating layer 3 (which is, in the case of a magnetic tunnel junction, a tunnel barrier) is optimised to provide a large amplitude of magnetoresistance tunnel and an important variation in perpendicular anisotropy as a function of the voltage. There is however limited flexibility in the adjustment of the properties of this layer. In contrast, the volume layer of the magnetic layer 2 is more freely adjustable, without modifying the properties of the device 10 which are sensitive to the magnetic layer 2/insulating layer 3 interface.

Nevertheless, as regards the surface layer 2-1, several adjustments are possible in order to regulate the amplitude and the thermal variation of the surface anisotropy.

The composition of this surface layer 2-1 is variable. If the surface layer 2-1 is an alloy of $(Co_{1-x}Fe_x)_{1-y}B_y$ type with the content y of B comprised between 10% and 25% and the content x of Fe comprised between 80% and 20%, it has been shown that the amplitude of the anisotropy perpendicular to the plane is greater with an alloy rich in Fe than with an alloy rich in Co (see "First-principles investigation of the very large perpendicular magnetic anisotropy at Fe/MgO and Co/MgO interfaces", Yang H. X. et al., Phys. Rev. B, 84, 054401 (2011)).

Moreover, it is known that the thermal variation in the surface anisotropy reported to the volume $$K_u = \frac{K_{SA}}{t_A + t_B}$$

follows a power law of the total magnetisation of the ferromagnetic layer, that is to say here the volume layer and the surface layer. It is expected that the variation in temperature of the surface anisotropy $K_u$ depends on the spontaneous magnetisation $M_s$ according to a power law:

$$\frac{K_u(T)}{K_u(0)} = \left(\frac{M_S(T)}{M_S(0)}\right)^\eta.$$

Given that the Curie temperature in $(Co_{1-x}Fe_x)_{1-y}B_y$ depends on the relative Co and Fe contents (the Curie temperature of Co is thus: $T_{Curie}Co=1394$ K whereas that of Fe is equal to: $T_{Curie}Fe=1043$ K), the thermal variation in the surface anisotropy may thus be adjusted by modifying the relative Co and Fe contents.

The total thickness of the total magnetic layer in contact with the non-magnetic insulating layer 3, that is to say the sum of the thickness $t_A$ and the thickness $t_B$, also has an influence on the thermal variation in the surface anisotropy because the thermal variation in the magnetisation depends on this thickness. In fact, in thin magnetic films, magnetic fluctuations have a tendency to develop more easily, which means that the thermal decrease in the magnetisation and thus the anisotropy is generally more pronounced for thin films than for thick films.

Figure 10:
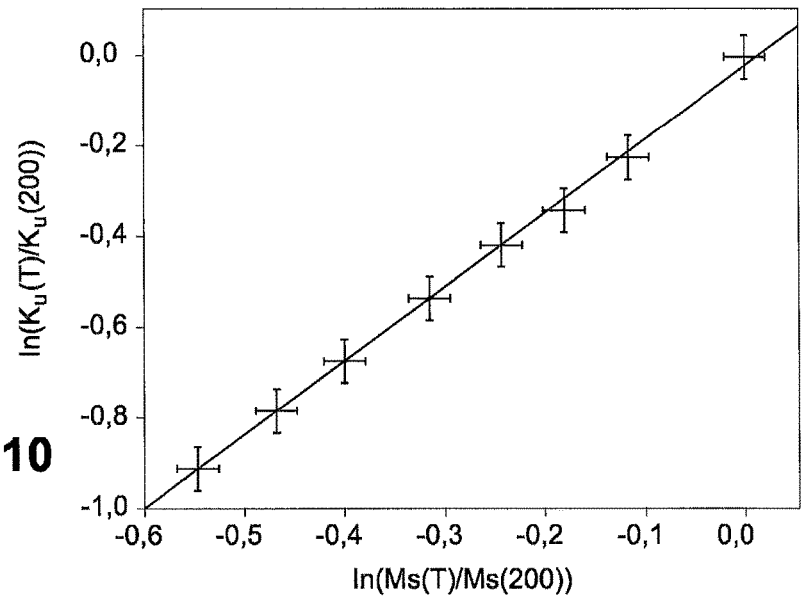
In FIG. 10, a graphic representation in logarithmic scale of the evolution of the surface anisotropy as a function of temperature, for an interface of $Co/AlO_x$ type with a Co thickness of 2 nm.

The thermal variation in the surface anisotropy is illustrated as an example in FIG. 10 for an interface of Co/AlOx type. For such a structure, with a thickness of Co of 2 nm, the exponent n of the above formula is equal to 1.7. This exponent may vary between 1.3 and 2.6 for thicknesses of Co ranging from 1.3 nm to 2.8 nm. The thermal variation in the surface anisotropy may thus be adjusted as a function of the thickness of Co.

Concerning now the volume layer 2-2 of the magnetic layer 2, this layer may be a single ferromagnetic layer or a multilayer composed of several magnetic and non-magnetic layers.

In the case where a material such as an alloy based on Co, Fe or Ni is used, the amplitude of the magnetisation and its thermal decrease may be adjusted by playing on the relative concentrations of these various elements, but also by introducing additional elements such as Cr, V, Ta, Cu, Hf, Ti, Nb, Zr, Mo, Zn, Al, Ge, Si. The incorporation of these non-magnetic elements in a ferromagnetic host makes it possible to reduce the Curie temperature of the material, which determines the thermal variation in the magnetisation and thus the thermal variation in the demagnetisation energy, which is proportional to the square of the magnetisation.

The volume layer 2-2 is strongly coupled magnetically with the surface layer 2-1. The coupling may be a direct exchange coupling between the volume and surface layers if they are in direct contact. The coupling may also be assured through the intermediary of an additional thin layer, such as for example a thin layer made of Ta, Ti or Ru, with a thickness typically comprised between 0.2 nm and 1 nm. In the case where the surface layer 2-1 is a layer of CoFeB, the thin layer made of Ta or Ti or Ru may be used to attract the B away from the non-magnetic insulating layer 3 during the phase of annealing the device 10. Such annealing phases are common in magnetic devices, either for defining a reference direction for the spin of the electrons, or, in the case of a MgO magnetic tunnel junction, to obtain a correct crystallisation of the tunnel barrier and the adjacent ferromagnetic electrodes.

The volume layer 2-2 may also comprise multilayers—in general used for their anisotropy perpendicular to the plane—such as a multilayer of (Co/Pt), (Co/Cu/Pt), (Co/Pd), (Co/Pt/Ni/Pt), (Co/Pd/Ni/Pd), (Co/Ni), (Cu/Ni) type. To obtain an anisotropy in the plane, several parameters are adjusted: the relative thickness of the magnetic layer, for example between 0.1 and 2 nm, and the non-magnetic layer, for example between 0.1 and 2 nm, at each repetition, as well as the number of repetitions, for example between 1 and 10. This is illustrated in FIGS. 11, 12, 13 and 14a-d.

Figure 11:
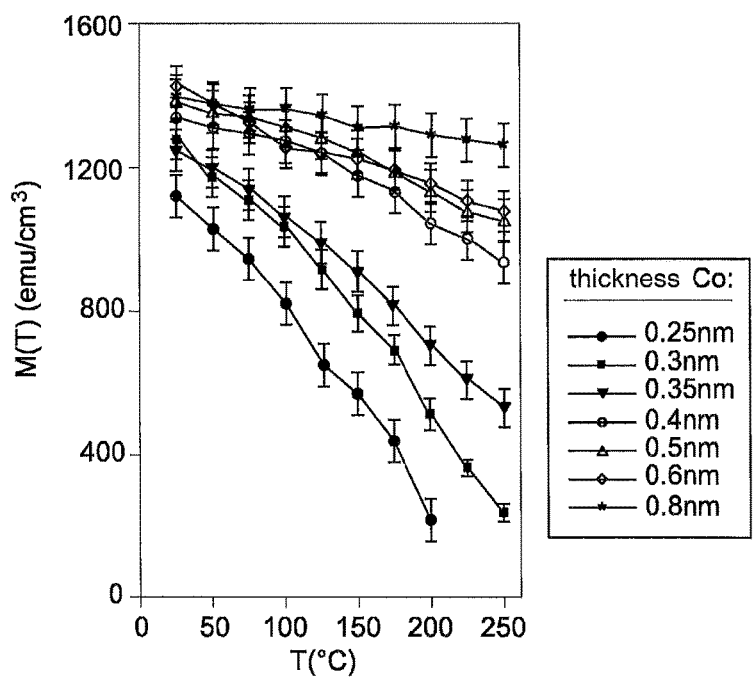
In FIG. 11, a graphic representation of the evolution of the magnetisation as a function of temperature for a multilayer of $Ta_3/Pt_5/(Co_{tco}/Cu_{0.4}/Pt_{0.4})_5/Cu_2/Pt_2$ type and for different thicknesses of Co.

For example, FIG. 11 illustrates the variation in magnetisation as a function of temperature in several multilayers of $Ta_3/Pt_5/(Co_{tco}/Cu_{0.4}/Pt_{0.4})_5/Cu_2/Pt_2$ type of which the thickness of the Co layer varies. It is clear from this figure that the thermal variation in the magnetisation, and in a correlative manner that of the anisotropy which is a power law of the magnetisation, may be adjusted as a function of the thickness of the layer of Co.

Figure 12:
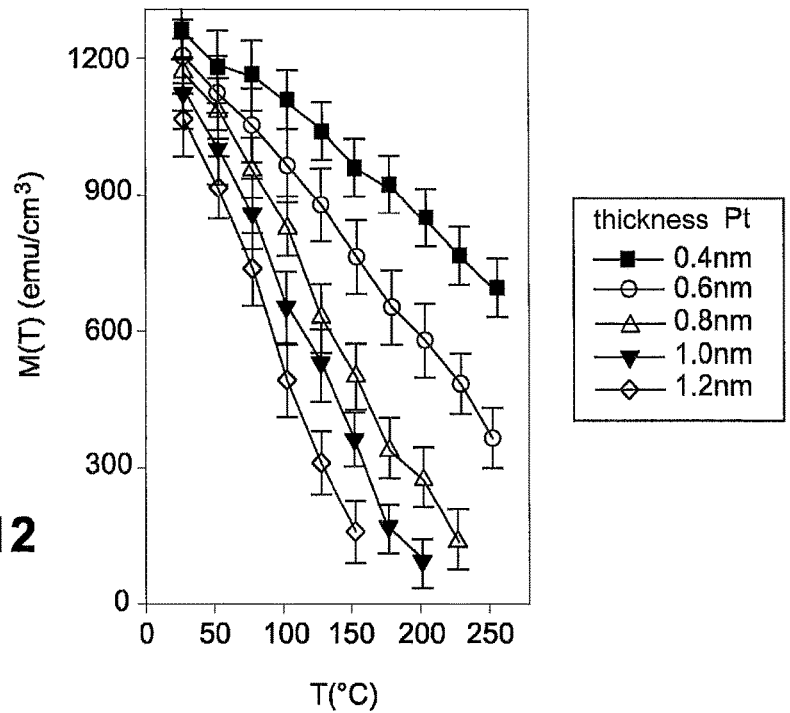
In FIG. 12, a graphic representation of the evolution of the magnetisation as a function of temperature for multilayers of $Ta_3/Pt_5/(Co_{0.3}/Pt_{tPd})_5/Cu_2/Pt_2$ and for different thicknesses of Pt.
Figure 13:
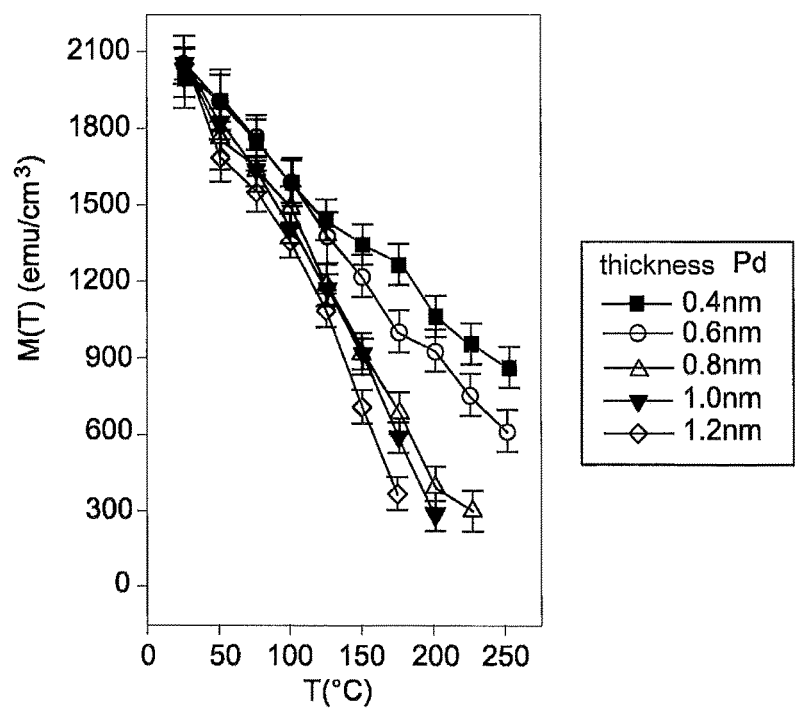
In FIG. 13, a graphic representation of the evolution of the magnetisation as a function of temperature for multilayers of $Ta_3/Pd_5/(Co_{0.3}/Pd_{tPd})_5/Cu_2/Pd_2$ and for different thicknesses of Pd.
Figure 14A:
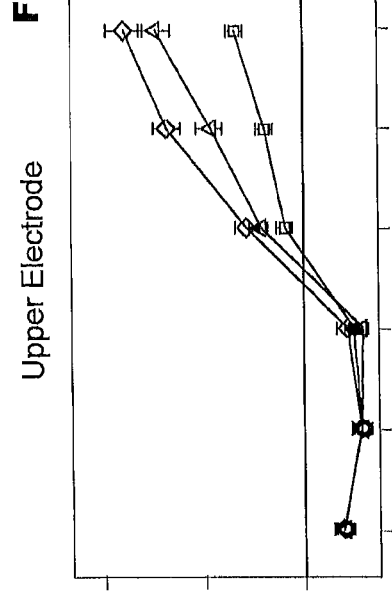
In FIG. 14a, a graphic representation of the evolution of the effective anisotropy in a multilayer of (Co/Pt)n type used as lower electrode, as a function of the number n of repetitions of the multilayer.
Figure 14C:
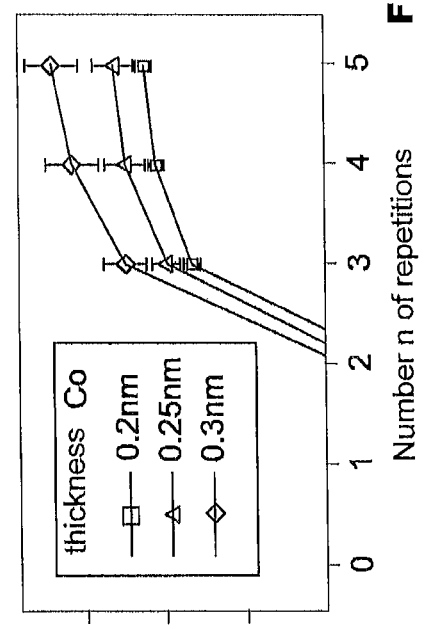
In FIG. 14c, a graphic representation of the evolution of the effective anisotropy in a multilayer of (Co/Pd)n type used as upper electrode, as a function of the number n of repetitions of the multilayer and for different thicknesses of Co.
Figure 14B:
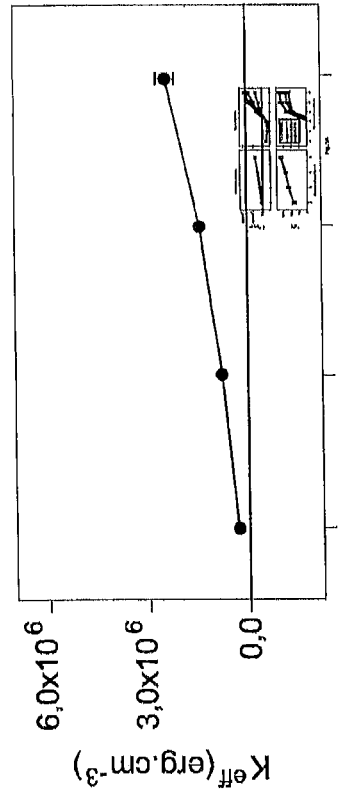
In FIG. 14b, a graphic representation of the evolution of the transition temperature in a multilayer of (Co/Pt)n type used as lower electrode, as a function of the number n of repetitions of the multilayer.
Figure 14D:
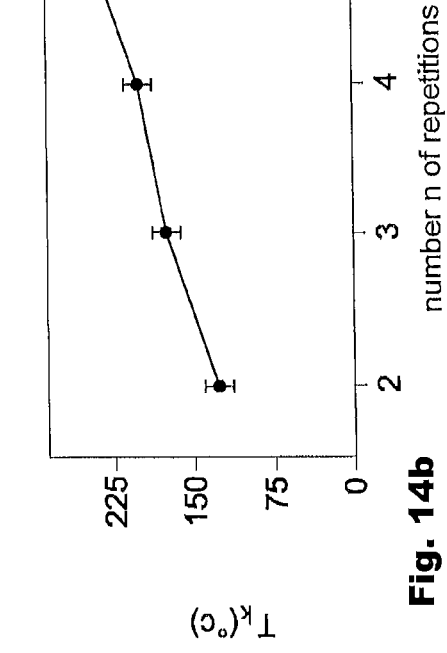
In FIG. 14d, a graphic representation of the evolution of the transition temperature in a multilayer of (Co/Pd)n type used as upper electrode, as a function of the number n of repetitions of the multilayer and for different thicknesses of Co.

Similarly, FIGS. 12 and 13 show the influence of the thickness of a non-magnetic spacer on the thermal decrease in magnetisation, respectively for multilayers of $Ta_3/Pd_5/(Co_{0.3}/Pt_{tPt})_5/Cu_2/Pt_2$ as a function of the thickness of the Pt spacer, and for multilayers of $Ta_3/Pd_5/(Co_{0.3}/Pd_{tPd})_5/Cu_2/Pd_2$ as a function of the thickness of the Pd spacer.

Another parameter which makes it possible to adjust the thermal decrease in the volume anisotropy is the number of repetitions of a multilayer, as illustrated in FIGS. 14a-d. With multilayers of Co/Pt or Co/Pd type for example, the transition temperature between an anisotropy perpendicular to the plane at low temperatures and in the plane at high temperatures may be adjusted with the number n of repetitions of the multilayer: (Co/spacer)n, the spacer being able to designate Pt or Pd. For example for two repetitions of Co/Pt, the transition is obtained at 130° C., whereas for five repetitions of Co/Pt it can go up to 250° C. For multilayers of Co/Pd, this transition temperature is considered to vary as a function of the number of repetitions but also as a function of the thickness of the Co layer: for three repetitions, the transition temperature goes from 130° C. to 190° C. when the thickness of the Co layer goes from 0.2 nm to 0.3 nm.

The chemical composition of the volume layer 2-2 may also be adjusted in order to adjust the thermal decrease in the anisotropy' of the volume layer 2-2 of the magnetic layer 2. For example, multilayers of type (Co/Pt/Ni/Pt) exhibit a decrease in their anisotropy as a function of temperature more quickly than multilayers of (Co/Pt) at similar thickness of magnetic material (Co, Ni) and at similar thickness of non-magnetic material. This is documented for example in the publication "Magnetic and magneto-optical properties of (Pt/Co/Pt/Ni) multilayer", of G. Srinivas et al., Thin Solid Films 301, 211-216 (1997).

The volume layer 2-2 may also include an alloy with a tetragonal structure $L1_0$, such as for example an alloy of FePt, FePd, FeNiPt, FeNiPd, FeCuPt or FeCuPd. When the tetragonal distortion is oriented out of plane, these alloys have a perpendicular anisotropy due to the magneto-crystalline anisotropy, which in this case can no longer be ignored compared to the shape anisotropy, and can thus contribute to obtaining a total anisotropy of the stack perpendicular to the plane. The substitution of certain elements of Fe by Ni or Cu makes it possible to reduce the Curie temperature of the alloy.

It is thus possible to intervene on a large number of parameters, both for the surface layer 2-1 and for the volume layer 2-2 of the magnetic layer 2, in order that thermal variations in the surface and volume anisotropies differ sufficiently little from each other so that the application of a polarisation voltage $V_{max}$ enables, over a desired operating temperature range, the transition of the effective anisotropy $K_{eff}$ from a direction perpendicular to the reference plane to a direction in the reference plane or vice versa. The volume layer 2-2, on account of notably its composition and its thickness, is used to adjust the volume anisotropy and thermal variations in the volume anisotropy whereas the surface layer 2-1 is used to regulate the surface anisotropy and thermal variations in the surface anisotropy.

To summarise, in this first embodiment, the surface anisotropy $K_{SA}$ and the volume anisotropies $K_{VA}$ and $K_{VB}$ thus respect, over a desired temperature range, the following equation:

$$0<K_{SA}(V=V_{max})<-(K_{VB}t_B+K_{VA}t_A)<K_{SA}(V=0)$$

According to a second embodiment:
the surface anisotropy $K_{SA}$ is in a direction perpendicular to the plane and the first and second volume anisotropies $K_{VB}$ and $K_{VA}$ are in a direction in the plane;
the effective anisotropy $K_{eff}$ is in a direction in the plane when no polarisation voltage is applied and in a direction perpendicular to the plane when a polarisation voltage $V_{max}$ is applied.

For this second embodiment:
the non-magnetic insulating layer 3 may be made of MgO, $AlO_x$, AlN, $SrTiO_3$, HfOx, TaOx or any other insulating oxide or nitride;
the surface layer 2-1, with thickness $t_A$, may be an alloy based on Co, Fe or Ni, or any other material leading, in combination with the non-magnetic insulating layer 3, to a perpendicular surface anisotropy and having an important variation as a function of the application or not of an electric field. If the device 10 is a magnetic tunnel junction, then the surface layer 2-1 must also provide an important magnetoresistance;
the volume layer 2-2, with thickness $t_B$, may be:
  a multilayer with a volume anisotropy in the plane, composed of n repetitions of a bilayer of type F1/N1, a bilayer of type F1/F2 or a quadrilayer of type F1/N1/F2/N2, where F1 and F2 are two ferromagnetic materials, such as for example Fe, Co, Ni, Gd and alloys thereof, and N1 and N2 are two non-magnetic materials, such as for example Cu, Cr, Ta, Ti, Hf, Mo, Ag, Au, Pd, Pt;
  a single layer with a volume anisotropy in the plane, made of an alloy such as FePt, FePd, FeNiPt, FeNiPd, FeCuPt or FeCuPd, having a tetragonal structure $L1_0$ with a tetragonal distortion oriented in the plane, that is to say with an easy magnetisation axis oriented in the plane;
  a single layer with a volume anisotropy in the plane, made of an alloy of type F1F2F3N1N2, where F1, F2 and F3 are three ferromagnetic materials, for example Fe, Co, Ni, Gd and alloys thereof, and N1 and N2 are two non-magnetic materials, for example Cr, Ta, Cu, Hf, Ti, Nb, Zr, Mo, Ag, Au, Pd, Pt. Examples of possible alloys are thus: CoCr, CoCrPt, CoCrTa, FeNiTa, CoFeCrPt. The interest of non-magnetic doping is to reduce the volume anisotropy in the plane in order to have an effective anisotropy $K_{eff}$ sufficiently close to zero and to be able to change its sign thanks to the application of an electric field;
the thickness $t_B$ of the volume layer 2-2 is chosen sufficiently high so that, when no polarisation voltage is applied, the volume anisotropy in the plane outweighs the surface anisotropy perpendicular to the plane, leading to an effective anisotropy $K_{eff}$ in the plane when no polarisation voltage is applied.

To summarise, the surface anisotropy $K_{SA}$ and the first and second volume anisotropies $K_{VB}$ and $K_{VA}$ thus respect, over a desired operating range, the following inequality:

$$0<K_{SA}(V=0)<-(K_{VB}t_B+K_{VA}t_A)<K_{SA}(V-V_{max})$$

with $K_{SA}$ (V=0) the surface anisotropy when no polarisation voltage is applied and $K_{SA}$ (V=$V_{max}$) the surface anisotropy when a polarisation voltage $V_{max}$ is applied.

According to a third embodiment:
the surface anisotropy $K_{SA}$ is in a direction in the plane and the first and second volume anisotropies $K_{VB}$ and $K_{VA}$ are in a direction perpendicular to the plane;
the effective anisotropy $K_{eff}$ is in a direction perpendicular to the plane when no polarisation voltage is applied and in a direction in the plane when a polarisation voltage $V_{max}$ is applied.

For this third embodiment:
the non-magnetic insulating layer 3 may be made of MgO, AlOx, AlN, $SrTiO_3$, HfOx, TaOx or any other insulating oxide or nitride and having an interfacial oxygen and/or nitrogen content such that a surface anisotropy in the plane is assured;
the surface layer 2-1, with thickness $t_A$, may be an alloy based on Co, Fe or Ni, or any other material leading, in combination with the non-magnetic insulating layer 3, to a surface anisotropy in the plane and having an important variation as a function of the application or not of an electric field. For example, interfaces of CoFeB/MgO type may provide a surface anisotropy in the plane if the MgO insulating layer is over-oxidised, so that certain elements of oxygen penetrate a little into the first atomic layer of CoFeB in contact with the MgO layer. If the device 10 is a magnetic tunnel junction, then the surface layer 2-1 must also provide a high magnetoresistance;
the volume layer 2-2, with thickness $t_B$, may be:
  a multilayer with a volume anisotropy perpendicular to the plane, composed of n repetitions of a bilayer of type F1/N1, a bilayer of type F1/F2 or a quadrilayer of type F1/N1/F2/N2, where F1 and F2 are two ferromagnetic materials, and N1 and N2 are two paramagnetic materials. Possible examples of bilayers are: Co/Pt, Co/Pd, Co/Ni, Co/Au, Ni/Cu;

a single layer with a volume anisotropy perpendicular to the plane, made of an alloy such as FePt, FePd, FeNiPt, FeNiPd, FeCuPt or FeCuPd, having a tetragonal structure $L1_0$ with an easy magnetisation axis oriented perpendicularly to the plane;

a single layer with a volume anisotropy perpendicular to the plane, made of an alloy of type F1F2F3N1N2, where F1, F2 and F3 are three ferromagnetic materials, and N1 and N2 are two paramagnetic materials. Examples of possible alloys are: CoCr, CoCrPt, in which the easy magnetisation axis is oriented perpendicularly to the plane;

the thickness $t_B$ of the surface layer 2-2 is chosen sufficiently large so that, when no polarisation voltage is applied, the volume anisotropy perpendicular to the plane outweighs the surface anisotropy in the plane, leading to an effective anisotropy $K_{eff}$ perpendicular to the plane when no polarisation voltage is applied.

To summarise, the surface anisotropy $K_{SA}$ and the first and second volume anisotropies $K_{VB}$ and $K_{VA}$ thus respect, over a desired operating range, the following inequality:

$$K_{SA}(V=V_{max}) < -(K_{VB}t_B K_{VA}t_A) < K_{SA}(V=0) < 0$$

with $K_{SA}$ (V=0) the surface anisotropy when no polarisation voltage is applied and $K_{SA}$ (V=$V_{max}$) the surface anisotropy when a polarisation voltage $V_{max}$ is applied.

According to a fourth embodiment:

the surface anisotropy $K_{SA}$ is in a direction in the plane and the first and second volume anisotropies $K_{VB}$ and $K_{VA}$ are in a direction perpendicular to the plane;

the effective anisotropy $K_{eff}$ is in a direction in the plane when no polarisation voltage is applied and in a direction perpendicular to the plane when a polarisation voltage $V_{max}$ is applied.

For this fourth embodiment:

the non-magnetic insulating layer 3 may be made of MgO, AlOx, AlN, SrTiO$_3$, HfOx, TaOx or any other insulating oxide or nitride and having an interfacial oxygen and/or nitrogen content such that a surface anisotropy in the plane is assured;

the surface layer 2-1, with thickness $t_A$, may be an alloy based on Co, Fe or Ni, or any other material leading, in combination with the non-magnetic insulating layer 3, to a surface anisotropy in the plane and having an important variation as a function of the application or not of an electric field. For example, interfaces of CoFeB/MgO type can supply a surface anisotropy in the plane if the insulating layer made of MgO is over-oxidised, so that certain elements of oxygen penetrate a little into the first atomic layer of CoFeB in contact with the layer of MgO. If the device 10 is a magnetic tunnel junction, then the surface layer 2-1 also supplies a high magnetoresistance;

the volume layer 2-2, with thickness $t_B$, may be:

a multilayer with a volume anisotropy perpendicular to the plane, composed of n repetitions of a bilayer of type F1/N1, a bilayer of type F1/F2 or a quadrilayer of type F1/N1/F2/N2, where F1 and F2 are two ferromagnetic materials, and N1 and N2 are two paramagnetic materials. Examples of possible bilayers are: Co/Pt, Co/Pd, Co/Ni, Co/Au, Ni/Cu;

a single layer with a volume anisotropy perpendicular to the plane, made of an alloy such as FePt, FePd, FeNiPt, FeNiPd, FeCuPt or FeCuPd, having a tetragonal structure $L1_0$ with an easy magnetisation axis oriented perpendicularly to plane;

a single layer with a volume anisotropy perpendicular to the plane, made of an alloy of type F1F2F3N1N2, where F1, F2 and F3 are three ferromagnetic materials, and N1 and N2 are two paramagnetic materials. Examples of possible alloys are: CoCr, CoCrPt, in which the easy magnetisation axis is oriented perpendicularly to the plane;

the thickness $t_B$ of the surface layer 2-2 is chosen sufficiently small so that, when no polarisation voltage is applied, the surface anisotropy in the plane outweighs the volume anisotropy perpendicular to the plane, leading to an effective anisotropy $K_{eff}$ in the plane when no polarisation voltage is applied.

To summarise, the surface anisotropy $K_{SA}$ and the first and second volume anisotropies $K_{VB}$ and $K_{VA}$ thus respect, over a desired operating range, the following inequality:

$$K_{SA}(V=0) < -(K_{VB}t_B K_{VA}t_A) < K_{SA}(V=V_{max}) < 0$$

with $K_{SA}$ (V=0) the surface anisotropy when no polarisation voltage is applied and $K_{SA}$ (V=$V_{max}$) the surface anisotropy when a polarisation voltage $V_{max}$ is applied.

The invention claimed is:

1. A voltage-controlled magnetic device comprising:
   a magnetic layer extending along a reference plane and having a variable direction magnetisation and an effective anisotropy $K_{eff}$;
   a non-magnetic insulating layer extending onto the magnetic layer;
   a contact layer extending onto the non-magnetic insulating layer;
   a polarisation voltage device configured to apply a polarisation voltage between the contact layer and the magnetic layer, through the non-magnetic insulating layer;
   said magnetic layer having an anisotropy switching threshold such that the application of a polarisation voltage $V_{max}$ through the non-magnetic insulating layer enables switching of the effective anisotropy $K_{err}$ from a direction perpendicular to the reference plane to a direction in the reference plane or vice versa,
   wherein the magnetic layer comprises:
   a first layer with thickness $t_B$, having a first volume anisotropy $K_{VB}$;
   a second layer with thickness $t_A$, having a surface anisotropy $K_{SA}$ and a second volume anisotropy $K_{VA}$, the second layer being situated between the first layer and the non-magnetic insulating layer;
   a composition and a thickness of the second and first layers being chosen in order that the surface anisotropy $K_{SA}$ and the first and second volume anisotropies $K_{VB}$ and $K_{VA}$ respect, over a given operating temperature range, the following inequality:

$$\text{Min}=(K_{SA}(V=0),K_{SA}(V=V_{max})) < -K_{VB}t_B + K_{VA}t_A < \text{Max}(K_{SA}(V=0),K_{SA}(V=V_{max}))$$

where $K_{SA}$ (V=0) is the surface anisotropy when no polarisation voltage is applied; $K_{SA}$ (V=$V_{max}$) is the surface anisotropy when the polarisation voltage $V_{max}$ is applied.

2. The magnetic device according to claim 1, wherein the non-magnetic insulating layer is made of MgO, AlOx, AlN, SrTiO$_3$, HfO$_x$ or any other insulating oxide or nitride having a dielectric polarisability greater than or equal to 6.

3. The magnetic device according to claim 1, wherein the effective anisotropy $K_{eff}$ is in a direction perpendicular to the reference plane when no polarisation voltage is applied;

the effective anisotropy $K_{eff}$ is in a direction in the reference plane when the polarisation voltage $V_{max}$ is applied.

4. The magnetic device according to claim 3, wherein
the surface anisotropy $K_{SA}$ of the second layer is in a direction perpendicular to the reference plane and the surface anisotropy $K_{SA}$ decreases when the polarisation voltage $V_{max}$ is applied;
the total volume anisotropy $K_{VB}t_B+K_{VA}t_A$ is in a direction in the reference plane.

5. The magnetic device according to claim 3, wherein
the surface anisotropy $K_{SA}$ of the second layer is in a direction in the reference plane and the surface anisotropy $K_{SA}$ increases when the polarisation voltage $V_{max}$ is applied;
the total volume anisotropy $K_{VB}t_B+K_{VA}t_A$ is in a direction perpendicular to the reference plane.

6. The magnetic device according to claim 1, wherein
the effective anisotropy $K_{eff}$ is in a direction in the reference plane when no polarisation voltage is applied;
the effective anisotropy $K_{eff}$ is in a direction perpendicular to the reference plane when the polarisation voltage $V_{max}$ is applied.

7. The magnetic device according to claim 6, wherein
the surface anisotropy $K_{SA}$ of the second layer is in a direction perpendicular to the reference plane and the surface anisotropy $K_{SA}$ increases when the polarisation voltage $V_{max}$ is applied;
the total volume anisotropy $K_{VB}t_B+K_{VA}t_A$ is in a direction in the reference plane.

8. The magnetic device according to claim 6, wherein
the surface anisotropy $K_{SA}$ of the second layer is in a direction in the reference plane and the surface anisotropy $K_{SA}$ decreases when the polarisation voltage $V_{max}$ is applied;
the total volume anisotropy $K_{VB}t_B+K_{VA}t_A$ is in a direction perpendicular to the reference plane.

9. The magnetic device according to claim 1, wherein the second layer is made of an alloy based on Co, Fe, Ni or any other material leading, in combination with the insulating layer, to a surface anisotropy $K_{SA}$ perpendicular to the reference plane and having a variation greater than 5% as a function of the application or not of the polarisation voltage $V_{max}$.

10. The magnetic device according to claim 1, wherein the first layer having the first volume anisotropy $K_{VB}$ is a multilayer stack of n elementary patterns of type F1/N1 or F1/N1/F2/N2 or F1/F2, with F1 and F2 two different ferromagnetic materials and N1 and N2 two different non-magnetic materials.

11. The magnetic device according to claim 1, wherein the first layer having the first volume anisotropy $K_{VB}$ is an alloy having a tetragonal structure $L1_0$.

12. The magnetic device according to claim 1, wherein the first layer having the first volume anisotropy $K_{VB}$ is a monolayer of an alloy of type F1F2F3N1N2, with F1, F2 and F3 three different ferromagnetic materials and N1 and N2 two different non-magnetic materials.

13. The magnetic device according to claim 1, wherein
the contact layer comprises, in contact with the non-magnetic insulating layer, a magnetic layer having a fixed magnetisation direction serving as reference direction for the magnetisation;
the non-magnetic insulating layer is a tunnel barrier enabling a current to circulate by tunnel effect between the contact layer and the magnetic layer;
the device then behaving like a magnetic tunnel junction.

14. The magnetic device according to claim 13, wherein
the magnetic layer of the contact layer is an alloy of CoFeB;
the non-magnetic insulating layer is made of MgO;
the second layer of the magnetic layer is an alloy of CoFeB.

* * * * *

UNITED STATES PATENT AND TRADEMARK OFFICE
CERTIFICATE OF CORRECTION

PATENT NO. : 9,508,920 B2  Page 1 of 1
APPLICATION NO. : 14/906770
DATED : November 29, 2016
INVENTOR(S) : Bernard Dieny et al.

It is certified that error appears in the above-identified patent and that said Letters Patent is hereby corrected as shown below:

On the Title Page

Item (71) Applicants:

The third Applicant was omitted. Please add the third Applicant to read:

UNIVERSITÉ JOSEPH FOURIER, Grenoble (FR)

In the Claims

Column 22, Line 54, Claim 1: there should be a "(" before "$K_{VB}$"

Signed and Sealed this
Twentieth Day of June, 2017

Joseph Matal
*Performing the Functions and Duties of the*
*Under Secretary of Commerce for Intellectual Property and*
*Director of the United States Patent and Trademark Office*